(12) United States Patent
King et al.

(10) Patent No.: US 12,393,749 B2
(45) Date of Patent: Aug. 19, 2025

(54) INTERACTIVE TOOL FOR SPECIFYING FACTOR RELATIONSHIPS IN DESIGN STRUCTURE

(71) Applicant: JMP Statistical Discovery LLC, Cary, NC (US)

(72) Inventors: Caleb Bridges King, Morrisville, NC (US); Joseph Albert Morgan, Raleigh, NC (US); Ryan Adam Lekivetz, Cary, NC (US); Bradley Allen Jones, Cary, NC (US); Jacob Davis Rhyne, Dallas, NC (US)

(73) Assignee: JMP STATISTICAL DISCOVERY LLC, Cary, NC (US)

( * ) Notice: Subject to any disclaimer, the term of this patent is extended or adjusted under 35 U.S.C. 154(b) by 0 days.

(21) Appl. No.: 18/819,134

(22) Filed: Aug. 29, 2024

(65) Prior Publication Data

US 2024/0419869 A1  Dec. 19, 2024

Related U.S. Application Data

(63) Continuation of application No. 17/881,120, filed on Aug. 4, 2022.

(Continued)

(51) Int. Cl.
*G06F 30/20* (2020.01)
*G06F 3/0482* (2013.01)
(Continued)

(52) U.S. Cl.
CPC .......... *G06F 30/20* (2020.01); *G06F 3/0482* (2013.01); *G06F 3/04845* (2013.01); *G06F 30/12* (2020.01)

(58) Field of Classification Search
CPC .... G06F 30/20; G06F 3/0482; G06F 3/04845; G06F 30/12
See application file for complete search history.

(56) References Cited

U.S. PATENT DOCUMENTS

| | | | |
|---|---|---|---|
| 5,253,331 | A | 10/1993 | Lorenzen et al. |
| 6,460,068 | B1 | 10/2002 | Novaes |

(Continued)

FOREIGN PATENT DOCUMENTS

JP  2002259464 A  9/2002

OTHER PUBLICATIONS

Goos, P. et al., "Optimal Experimental Design in the Presence of Nested Factors", Technometrics, vol. 61 No. 4, Apr. 25, 2019, pp. 533-544, Taylor & Francis.

(Continued)

*Primary Examiner* — Ryan F Pitaro
*Assistant Examiner* — Bernard E Cothran
(74) *Attorney, Agent, or Firm* — COATS & BENNETT, PLLC

(57) ABSTRACT

A computing device obtains first and second factors for a nesting design and first and second sets of candidate options for the first and second factors, respectively. The computing device also receives a nesting indication that the second factor is nested within the first factor. The computing device generates the nesting design by portioning the first and second sets of candidate options into respective first and second different sets of groups. Based on the nesting indication, the computing device generates an assignment of groups for a design, and also selects options in the nesting design for the first and second factors based on the assignment of groups. The computing device also generates terms for a computer model for a computer simulation of the nesting design, as well as one or more computer-generated (Continued)

assessments of the nesting design based on the computer simulation.

30 Claims, 25 Drawing Sheets

Related U.S. Application Data

(60) Provisional application No. 63/327,447, filed on Apr. 5, 2022, provisional application No. 63/315,039, filed on Feb. 28, 2022.

(51) Int. Cl.
*G06F 3/04845* (2022.01)
*G06F 30/12* (2020.01)

(56) References Cited

U.S. PATENT DOCUMENTS

| | | | |
|---|---|---|---|
| 6,577,982 | B1 | 6/2003 | Erb |
| 8,019,049 | B2 | 9/2011 | Allen, Jr. |
| 8,046,090 | B2 | 10/2011 | MacArthur et al. |
| 8,121,818 | B2 | 2/2012 | Gorinevsky |
| 8,495,583 | B2 | 7/2013 | Bassin et al. |
| 8,595,750 | B2 | 11/2013 | Agarwal |
| 8,756,460 | B2 | 6/2014 | Blue et al. |
| 8,866,818 | B2 | 10/2014 | Rubin et al. |
| 9,218,271 | B2 | 12/2015 | Segall et al. |
| 9,529,700 | B2 | 12/2016 | Raghavan et al. |
| 10,338,993 | B1 | 7/2019 | Lekivetz et al. |
| 10,386,271 | B1 | 8/2019 | King et al. |
| 11,346,751 | B1 | 5/2022 | King et al. |
| 2003/0233600 | A1 | 12/2003 | Hartman et al. |
| 2005/0055193 | A1* | 3/2005 | Bondarenko ......... G16B 50/30 703/22 |
| 2008/0256392 | A1 | 10/2008 | Garland et al. |
| 2009/0292180 | A1 | 11/2009 | Mirow |
| 2010/0030521 | A1 | 2/2010 | Akhrarov |
| 2010/0169853 | A1 | 7/2010 | Jain et al. |
| 2012/0084043 | A1 | 4/2012 | Courtade et al. |
| 2015/0046906 | A1 | 2/2015 | Segall |
| 2015/0213631 | A1 | 7/2015 | Vander Broek |
| 2015/0309918 | A1 | 10/2015 | Raghavan |
| 2016/0012152 | A1 | 1/2016 | Johnson |
| 2016/0048628 | A1 | 2/2016 | Chien et al. |
| 2016/0253466 | A1 | 9/2016 | Agaian et al. |
| 2016/0299836 | A1 | 10/2016 | Kuhn et al. |
| 2017/0103013 | A1 | 4/2017 | Grechanik |
| 2018/0060469 | A1* | 3/2018 | Morgan .............. G06F 30/20 |

OTHER PUBLICATIONS

Goos, P. et al., "A General Strategy for Analyzing Data From Split-Plot and Multistratum Experimental Designs", Technometrics, vol. 54 No. 4, Nov. 1, 2012, pp. 340-354, Taylor & Francis.
Kuhn, R. et al., "Software Fault Interactions and Implications for Software Testing"; IEEE Transaction on Software Engineering; Jun. 2004; pp. 418-421; vol. 30, No. 6.
Bryce, R. et al., "Prioritized interaction testing for pair-wise coverage with seeding and constraints"; Information and Software Technology; Feb. 27, 2006; pp. 960-970; vol. 48, No. 10.
Chandrasekaran, J. et al., "Evaluating the effectiveness of BEN in localizing different types of software fault"; IEEE 9th International Conference on Software Testing, Verification and Validation Workshops; Apr. 10, 2016; pp. 1-31.
Colbourn, C. et al., "Locating and Detecting Arrays for Interaction Faults"; Journal of Combinatorial Optimization; 2008; pp. 1-34; vol. 15, No. 1.
Dalal, S. et al., "Factor-Covering Designs for Testing Software"; Technometrics; Aug. 1998; pp. 1-14; vol. 40, No. 3.
Demiroz, G. et al., "Cost-Aware Combinatorial Interaction Testing"; Proc. of the International Conference on Advances in System Testing and Validation Lifecycles; 2012; pp. 1-8.
Elbaum, S. et al., "Selecting a Cost-Effective Test Case Prioritization Technique"; Software Quality Journal; Apr. 20, 2004; pp. 1-26; vol. 12, No. 3.
Ghandehari, L. et al., "Identifying Failure-Inducing Combinations in a Combinatorial Test Set"; IEEE Fifth International Conference on Software Testing, Verification and Validation; Apr. 2012; pp. 1-10.
Ghandehari, L., et al., "Fault Localization Based on Failure-Inducing Combinations"; IEEE 24th International Symposium on Software Reliability Engineering; Nov. 2013; pp. 168-177.
Hartman, A., "Software and Hardware Testing Using Combinatorial Covering Suites"; The Final Draft; Jul. 3, 2018; pp. 1-41; IBM Haifa Research Laboratory.
Katona, G., "Two Applications (for Search Theory and Truth Functions) of Sperner Type Theorems"; Periodica Mathematica Hungarica; 1973; pp. 19-26; vol. 3, No. 1-2.
Cohen, M. et al., "Interaction Testing of Highly-Configurable Systems in the Presence of Constraints"; ISSTA '07 London, England, United Kingdom; Jul. 9-12, 2007; pp. 1-11; ACM 978-1-59593-734-6/07/0007.
Cohen, M.et al., "The Combinatorial Design Approach to Automatic Test Generation"; IEEE Software; Sep. 1996; pp. 83-88; vol. 13, No. 5.
Dunietz, I. et al., "Applying Design of Experiments to Software Testing"; Proceedings of 19th ECSE, New York, NY; 1997; pp. 205-215; ACM, Inc.
Cohen, M. et al., "The AETG System: An Approach to Testing Based on Combinatorial Design"; IEEE Transactions on Software Engineering; Jul. 1997; pp. 437-444; vol. 23, No. 7.
Morgan, J. et al. "Combinatorial Testing: An Approach to Systems and Software Testing Based on Covering Arrays"; Book—Analytic Methods in Systems and Software Testing; 2018; pp. 131-158; John Wiley & Sons Ltd.; Hoboken, NJ, US.
Cohen, M. et al. "Constructing Interaction Test Suites for Highly-Configurable Systems in the Presence of Constraints: A Greedy Approach"; IEEE Transactions on Software Engineering; Sep./Oct. 2008; pp. 633-650; vol. 34, No. 5.
Colbourn, C. et al., "Coverage, Location, Detection, and Measurement"; IEEE Ninth International Conference on Software Testing, Verification and Validation Workshops; Apr. 2016; pp. 19-25.
Kleitman, D. et al., "Families of k-Independent Sets"; Discrete Mathematics; 1973; pp. 255-262; vol. 6, No. 3.
Johnson, K. et al., "Largest Induced Subgraphs of the n-Cube That Contain No 4-Cycles"; Journal of Combinatorial Theory; 1989; pp. 346-355; Series B 46.
Dalal, S., et al.,"Model-Based Testing in Practice"; Proceedings of the 21st ICSE, New York, NY; 1999; pp. 1-10.
Moura, L., et al. "Covering Arrays with Mixed Alphabet Sizes"; Journal of Combinatorial Design; 2003; pp. 413-432; vol. 11, No. 6.
Brownlie, R. et al., "Robust Testing of AT&T PMX/StarMAIL Using OATS"; AT&T Technical Journal, May 1992; pp. 41-47; vol. 73, No. 3.
Mandl, R., "Orthogonal Latin Squares: An Application of Experiment Design to Compiler Testing"; Communications of the ACM; Oct. 1985; pp. 1054-1058; vol. 28, No. 10.
Hartman, A. et al., "Problems and algorithms for covering arrays"; Discrete Mathematics; 2004; pp. 149-156; vol. 284, No. 1-3.
Angel, M., "Conducting Experiments with Experiment Manager", Proceedings of the 1996 Winter Simulation Conference, Nov. 8, 1996, pp. 535-541, https://doi.org/10.1145/256562.256741.
Genta, G. et al., "Study of measurement process capability with non-normal data distributions", 15th CIRP Conference on Computer Aided Tolerancing—CIRP CAT 2018, 2018, pp. 385-390, Elsevier B.V.
Ghanbari, M. et al., "Visualization Overview", 39th Southeastern Symposium on System Theory, Mercer University Macon, GA, 31207, Mar. 4-6, 2007, pp. 135-137.
Iversen, P. et al., "Visualizing Experimental Designs for Balanced ANOVA Models using Lisp-Stat", Journal of Statistical Software, Feb. 2005, vol. 13, Issue 3, pp. 1-18.

(56) References Cited

OTHER PUBLICATIONS

Jang, D-H, et al., "Correlation-Based r-plot for Evaluating Supersaturated Designs", Research Article, Quality and Reliability Engineering International, Published online Mar. 11, 2013, pp. 503-512, (wileyonlinelibrary.com) DOI: 10.1002/qre.1503.

Kay, P., "Why design experiments Reason 2 Process understanding", JMP Blog post, May 1, 2018, pp. 1-10, obtained Oct. 1, 2018.

Kim, Y. et al., "Graphical Methods for Evaluating Covering Arrays", LA-UR-15-26286 (Accepted Manuscript), provided to the Los Alamos National Laboratory Aug. 31, 2016, pp. 1-23.

Mcneese, B., "Evaluating the Measurement Process (EMP) Overview", 2019, pp. 1-12, BPI Consulting, LLC.

Mcneese, B., "Evaluating the Measurement Process—Part 2", 2015, pp. 1-11, BPI Consulting, LLC.

Minitab 19 Support, "Which measurement system analyses are included in Minitab", Supporting Topics www.support.minitab.com/, obtained online May 20, 2021, pp. 1-2.

Quality-One, "Measurement System Analysis (MSA)", Obtained online Jun. 10, 2021, pp. 1-7, obtained from: https://quality-one.com/msa/.

Taylor, W. et al. "A Structure Diagram Symbolization for Analysis of Variance", The American Statistician, vol. 35, No. 2, May 1981, pp. 85-93, Taylor & Francis, Ltd.

weibull.com, "Measurement Systems Analysis in DOE++", Reliability Engineering Resources, issue 153, Nov. 2013, obtained May 20, 2021, pp. 1-5.

\* cited by examiner

Gauge R&R Metrics Estimator Performance — 1032

| Variance Component | Estimated Std Err | Metric | Estimated Bias | Estimated Std Err |
|---|---|---|---|---|
| Gauge R&R | 26.666 | % Gauge R&R | 0.4597 | 20.311 |
| Repeatability | 1.4939 | Precision to Part Variation | -4.054 | 194.85 |
| Reproducibility | 26.642 | | | |
| Part | 11.095 | | | |
| Total | 36.747 | | | |

1034, 1036

EMP Metrics Estimator Performance

| Metric | Estimated Bias | Estimated Std Err |
|---|---|---|
| Intraclass Correlation (no bias) | 1.5194 | 50.578 |
| Intraclass Correlation (with bias) | 0.8104 | 11.939 |
| Intraclass Correlation (with bias and interactions) | 0.0178 | 0.1049 |

Back 1030, 1038

*FIG. 10B*

Gauge R&R Metrics Estimator Performance — 1042

| Variance Component | Estimated Std Err | Metric | Estimated Bias | Estimated Std Err |
|---|---|---|---|---|
| Gauge R&R | 49.771 | % Gauge R&R | 9.4756 | 46.137 |
| Repeatability | 1.5234 | Precision to Part Variation | -14.94 | 185.98 |
| Reproducibility | 49.751 | | | |
| Part | 32.843 | | | |
| Total | 54.407 | | | |

1044, 1046

EMP Metrics Estimator Performance

| Metric | Estimated Bias | Estimated Std Err |
|---|---|---|
| Intraclass Correlation (no bias) | 1.3817 | 23.073 |
| Intraclass Correlation (with bias) | 0.5655 | 10.289 |
| Intraclass Correlation (with bias and interactions) | 0.0649 | 0.1998 |

| Variance Component | Estimated Std Err | Metric | Estimated Bias | Estimated Std Err |
|---|---|---|---|---|
| Gauge R&R | 30.498 | % Gauge R&R | 46.521 | 48.047 |
| Repeatability | 0.3982 | Precision to Part Variation | -3.345 | 201.77 |
| Reproducability | 30.491 | | | |

FIG. 11D

| Variance Component | Estimated Std Err | Metric | Estimated Bias | Estimated Std Err |
|---|---|---|---|---|
| Gauge R&R | 26.666 | % Gauge R&R | 0.4597 | 20.311 |
| Repeatability | 1.4939 | Precision to Part Variation | -4.054 | 194.85 |
| Reproducability | 26.642 | | | |

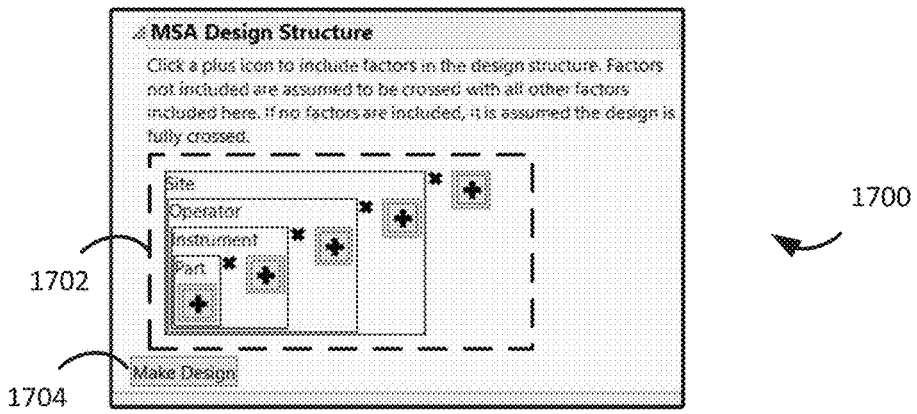

FIG. 17A

| Example Factor List for Operator<br>Nesting List: Instrument, Part<br>Nested Within List: Site | Example Factor List for Site<br>Nesting List: Operator, Instrument, Part<br>Nested Within List: |
|---|---|
| FIG. 17B | FIG. 17C |

| Example Factor List for Instrument<br>Nesting List: Part<br>Nested Within List: Site, Operator | Example Factor List for Part<br>Nesting List:<br>Nested Within List: Site, Operator, Instrument |
|---|---|
| FIG. 17D | FIG. 17E |

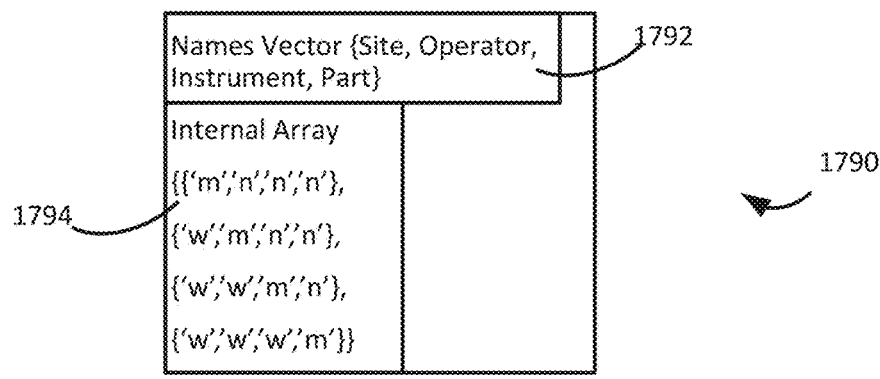

FIG. 17F

INTERACTIVE TOOL FOR SPECIFYING FACTOR RELATIONSHIPS IN DESIGN STRUCTURE

CROSS-REFERENCE TO RELATED APPLICATIONS

This application is a continuation of application Ser. No. 17/881,120, filed Aug. 4, 2022, which claims the benefit of, and priority based on, 35 U.S.C. § 119 to U.S. Provisional Application No. 63/315,039, filed Feb. 28, 2022, and U.S. Provisional Application No. 63/327,447, filed Apr. 5, 2022, the disclosures of each of which are incorporated herein by reference in their entirety.

BACKGROUND

When designing and conducting experiments, factors in the experiment can be crossed with one another. For instance, with crossed categorical factors, in a full factorial design every level of one factor is paired with every level of another factor, so that all possible combinations appear in the design. As an example, a design for a measurement systems analysis may have 3 operators tasked with measuring 10 parts with 2 instruments. In a fully crossed design, each operator would measure every part with every instrument. However, in practice, circumstances may arise that prevent a crossed design from being implemented. For example, if the measurement system analysis were conducted at two different sites, it may be impractical to move the operators, parts, and instruments between the different sites. In such cases, nested designs may be used. For instance, operator, part, and instrument factors can be nested within a site factor so that not every site is paired with every other operator, part, and instrument.

SUMMARY

In an example embodiment, the present disclosure provides a computer-program product tangibly embodied in a non-transitory machine-readable storage medium. The computer-program product includes system instructions operable to cause a computing system to obtain a first factor for a nesting design and first set of candidate options for the first factor. The computer-program product also includes instructions operable to cause the computing system to obtain a second factor for the nesting design and a second set of candidate options for the second factor. Additionally, the computer-program product includes instructions operable to cause the computing system to receive, using a graphical user interface, a nesting indication that the second factor is nested within the first factor and generate the nesting design. To generate the nesting design, the computer-program product includes instructions operable to cause the computing system to portion the first set of candidate options into at least two groups of a first set of groups and portion the second set of candidate options into at least two groups of a second set of groups. The first set of groups are different from the second set of groups. Additionally, to generate the nesting design, the computer-program product includes instructions operable to cause the computing system to generate, based on the nesting indication, an assignment of groups for a design. The assignment of groups assigns a first group from the first set of groups for use with a second group of the second set of groups in the nesting design. Additionally, to generate the nesting design, the computer-program product includes instructions operable to cause the computing system to select, based on the assignment of groups, options in the nesting design for the first factor from the first set of candidate options, and select, based on the assignment of groups, options in the nesting design for the second factor from the second set of candidate options. The computer-program product also includes instructions operable to further cause the computing system to generate terms for a computer model for a computer simulation of the nesting design. An amount of terms in the computer model are constrained by the computing system according to the nesting indication that the second factor is nested within the first factor. The computer-program product also includes instructions operable to cause the computing system to generate one or more computer-generated assessments of the nesting design based on the computer simulation of the nesting design according to the computer model.

Embodiments disclosed herein also include a corresponding apparatus and method. For example, in another example embodiment, the present disclosure provides a computer-implemented method. The method comprises obtaining a first factor for a nesting design and first set of candidate options for the first factor, obtaining a second factor for the nesting design and a second set of candidate options for the second factor, and receiving, using a graphical user interface, a nesting indication that the second factor is nested within the first factor. The method also comprises a computing system generating the nesting design by portioning the first set of candidate options into at least two groups of a first set of groups and portioning the second set of candidate options into at least two groups of a second set of groups. The first set of groups are different from the second set of groups. The method also comprises the computing system generating the nesting design by generating, based on the nesting indication, an assignment of groups by the computing system for a design. The assignment of groups assigns a first group from the first set of groups for use with a second group of the second set of groups in the nesting design. The method also comprises the computing system generating the nesting design by selecting, based on the assignment of groups, options in the nesting design for the first factor from the first set of candidate options and selecting, based on the assignment of groups, options in the nesting design for the second factor from the second set of candidate options. The method also comprises the computing system generating terms for a computer model for a computer simulation of the nesting design. In the example embodiment, an amount of terms in the computer model are constrained by the computing system according to the nesting indication that the second factor is nested within the first factor. The method also comprises the computing system generating one or more computer-generated assessments of the nesting design based on the computer simulation of the nesting design according to the computer model.

In another example embodiment, the present disclosure provides a computing device comprising a processor and a memory containing instructions executable by the processor. In this example embodiment, executing the instructions by the processor configures the computing device to obtain a first factor for a nesting design and first set of candidate options for the first factor, obtain a second factor for the nesting design and a second set of candidate options for the second factor, and receive, using a graphical user interface, a nesting indication that the second factor is nested within the first factor. Additionally, executing the instructions by the processor configures the computing device to generate the nesting design by portioning the first set of candidate options into at least two groups of a first set of groups and portioning the second set of candidate options into at least two groups of a second set of groups. The first set of groups and the second set of groups are different. Executing the instructions by the processor configures the computing device to generate the nesting design by generating, based on the nesting indication, an assignment of groups for a design. The assignment of groups assigns a first group from the first set of groups for use with a second group of the second set of groups in the nesting design. Executing the instructions by the processor configures the computing device to generate the nesting design by selecting, based on the assignment of groups, options in the nesting design for the first factor from the first set of candidate options and selecting, based on the assignment of groups, options in the nesting design for the second factor from the second set of candidate options. Executing the instructions by the processor configures the computing device to generate terms for a computer model for a computer simulation of the nesting design. An amount of terms in the computer model are constrained by the computing device according to the nesting indication that the second factor is nested within the first factor. Executing the instructions by the processor configures the computing device to generate one or more computer-generated assessments of the nesting design based on the computer simulation of the nesting design according to the computer model.

Other features and aspects of example embodiments are presented below in the Detailed Description when read in connection with the drawings presented with this application.

BRIEF DESCRIPTION OF THE DRAWINGS

FIGS. 10A-10E illustrate example graphical user interfaces for generating a nested design and design diagnostics according to at least one embodiment of the present technology.

FIGS. 11A-11E illustrate an example graphical user interface for updating design diagnostics according to at least one embodiment of the present technology.

FIG. 15 illustrates an example of a nesting design for continuous factors according to at least one embodiment of the present technology.

FIGS. 17A-17F provides example computing structures for a nested design according to at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
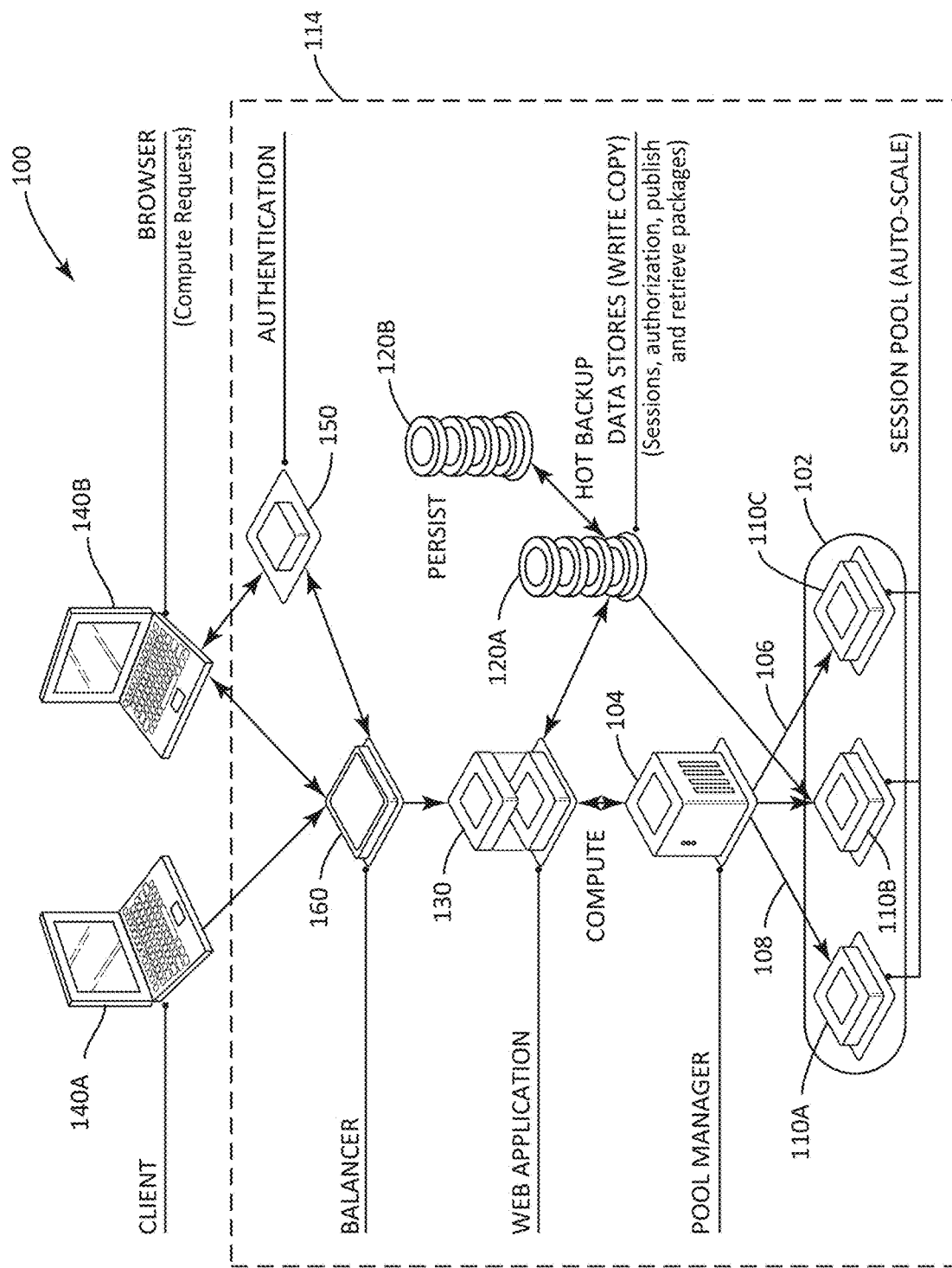
FIG. 1 illustrates an example network, including an example set of devices communicating with each other, according to at least one embodiment of the present technology.

FIG. 1 illustrates an example network 100 including an example set of devices communicating with each other (e.g., over one or more of an exchange system or a network), according to embodiments of the present technology. Network 100 includes network devices configured to communicate with a variety of types of client devices, for example, client devices 140, over a variety of types of communication channels. A client device 140 may be configured to communicate over a public or private network (e.g., client device 140B is configured to support a browser for computing requests or providing authentication).

Network devices and client devices can transmit a communication over a network 100. Network 100 may include one or more of different types of networks, including a wireless network, a wired network, or a combination of a wired and wireless network. Examples of suitable networks include the Internet, a personal area network, a local area network (LAN), a wide area network (WAN), a wireless local area network (WLAN), cloud network, or a cellular network. A wireless network may include a wireless interface or combination of wireless interfaces. As an example, a network in the one or more networks may include a short-range communication channel, such as a Bluetooth or a Bluetooth Low Energy channel. A wired network may include a wired interface. The wired and/or wireless networks may be implemented using routers, access points, base stations, bridges, gateways, or the like, to connect devices in the network. The one or more networks can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS), or other available protocols such as according to an Open Systems Interaction model. In addition, data and/or transactional details may be encrypted. Networks may include other devices for infrastructure for the network. For example, a cloud network may include cloud infrastructure system on demand. As another example, one or more client devices may utilize an Internet of Things (IoT) infrastructure where things (e.g., machines, devices, phones, sensors) can be connected to networks and the data from these things can be collected and processed within the things and/or external to the things. IoT may be implemented with various infrastructure such as for accessibility (technologies that get data and move it), embed-ability (devices with embedded sensors), and IoT services. Industries in the IoT space may include automotive (connected car), manufacturing (connected factory), smart cities, energy and retail.

Network devices and client devices can be different types of devices or components of devices. For example, client device 140 is shown as a laptop and balancer 160 is shown as a processor. Client devices and network devices could be other types of devices or components of other types of devices such as a mobile phone, laptop computer, tablet computer, temperature sensor, motion sensor, and audio sensor. Additionally, or alternatively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, and flow rate sensors. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current. The sensors may be mounted to various components used as part of a variety of different types of systems (e.g., an oil drilling operation). The network devices may detect and record data related to the environment that it monitors, and transmit that data to network 100.

As noted, one type of system that may include various sensors that collect data to be processed and/or transmitted to a computing environment (not shown) according to certain embodiments includes an oil drilling system. For example, the one or more drilling operation sensors may include, for example, surface sensors that measure a standpipe pressure, a surface torque, and a rotation speed of a drill pipe, and downhole sensors that measure a rotation speed of a bit and fluid densities. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration and pump pressure may also be stored and used for modeling, prediction, or classification.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device or client device may include a home automation switch that may be coupled with a home appliance. In another embodiment, a network or client device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment (e.g., computing environment or another computing environment not shown) according to certain embodiments includes a manufacturing environment (e.g., manufacturing products or energy). A variety of different network devices may be included in an energy pool, such as various devices within one or more power plants, energy farms (e.g., wind farm, and solar farm) energy storage facilities, factories, homes and businesses of consumers. One or more of such devices may include one or more sensors that detect energy gain or loss, electrical input or output or loss, and a variety of other efficiencies. These sensors may collect data to inform users of how the energy pool, and individual devices within the pool, may be functioning and how they may be made more efficient. In a manufacturing environment, image data can be taken of the manufacturing process or other readings of manufacturing equipment. For example, in a semiconductor manufacturing environment, images can be used to track, for example, process points (e.g., movement from a bonding site to a packaging site), and process parameters (e.g., bonding force, electrical properties across a bond of an integrated circuit).

Network device sensors may also perform processing on data it collects before transmitting the data to a computing environment, or before deciding whether to transmit data to a computing environment. For example, network devices may determine whether data collected meets certain rules, for example by comparing data or values calculated from the data and comparing that data to one or more thresholds. The network device may use this data and/or comparisons to determine if the data should be transmitted to a computing environment for further use or processing.

Devices in computing environment 114 may include specialized computers, servers, or other machines that are configured to individually and/or collectively process large amounts of data (e.g., using a session pool 102). The computing environment 114 may also include storage devices (e.g., data stores 120) that include one or more databases of structured data, such as data organized in one or more hierarchies, or unstructured data. The databases may communicate with the processing devices within computing environment 114 to distribute data to them and store data used in the computing environment 114. Computing environment 114 may collect, analyze and/or store data from or pertaining to communications, client device operations, client rules, and/or user-associated actions stored at one or more devices in computing environment 114. Such data may influence communication routing to the devices within computing environment 114, and how data is stored or processed within computing environment 114, among other actions.

Network 100 may also include one or more network-attached data stores 120. Network-attached data stores 120 are used to store data to be processed by the computing environment 114 as well as any intermediate or final data generated by the computing system in non-volatile memory. For instance, data stores 120 can perform functions such as writing and copying data and can provide data storage for network functions such as sessions, authorization, publishing and retrieving packages. In certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores 120 may store a variety of different types of data organized in a variety of different ways and from a variety of different sources. For example, network-attached data stores 120 may include storage other than primary storage located within computing environment 114 that is directly accessible by processors located therein. Network-attached data stores 120 may include secondary, tertiary, auxiliary, or back-up storage (e.g., data storage 120B), such as large hard drives, servers, and virtual memory, among other types. Storage devices may include portable or non-portable storage devices, optical storage devices, and various other mediums capable of storing and containing data (e.g., computer a machine-readable storage medium or computer-readable storage medium such as computer readable medium 210 in FIG. 2).

Furthermore, the data stores may hold a variety of different types of data. For example, network-attached data stores 120 may hold unstructured (e.g., raw) data, such as manufacturing data (e.g., a database containing records identifying products being manufactured with parameter data for each product, such as performance metrics or criteria) or product sales databases (e.g., a database containing individual data records identifying details of individual product performance).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Other devices can further be used to influence communication routing and/or processing between devices within computing environment 114 and with devices outside of computing environment 114. For example, as shown in FIG. 1, computing environment 114 may include a device 130 supporting a web application. Thus, computing environment 114 can retrieve data of interest, such as client information (e.g., product information, client rules, etc.), technical product details, news, current or predicted weather, and so on. Balancer 160 can be used to balance and direct load within the computing environment 114. Authentication device 150 can be used to provide authentication or other security protocols for a client device, user or group accessing computing environment 114.

In addition to computing environment 114 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from sensors as the sensors continuously sense, monitor and track changes in their environments. Devices within computing environment 114 may also perform pre-analysis on data it receives to determine if the data received should be processed as part of an ongoing project. The data received and collected by computing environment 114, no matter what the source or method or timing of receipt, may be processed over a period of time for a client to determine results data based on the client's needs and rules.

FIG. 1 includes a pool of devices with a pool manager 104 and session pool 102. Network 100 includes a variety of pool managers (e.g., pool manager 104) and worker nodes 110 (e.g., devices, servers, or server farms of session pool 102), according to embodiments of the present technology. Devices of session pool 102 are communicatively connected (e.g., via communication path 108 and communication path 106). Therefore, the pool manager may transmit information (e.g., related to the session pool 102 or notifications), to and receive information from each other. Although only one pool manager 104 is shown in FIG. 1, the network 100 may include more pool managers or a different kind of device manager (e.g., a dedicated resource manager).

Session pool 102 includes one or more worker nodes (e.g., worker node 110A). Shown in FIG. 1 are three worker nodes 110A-C merely for illustration, more or less worker nodes could be present. For instance, the pool manager 104 may itself be a worker node and may not need further worker nodes to complete a task. A given worker node could include dedicated computing resources or allocated computing resources as needed to perform operations as directed by the pool manager 104. The number of worker nodes included in a session pool 102 may be dependent, for example, upon how large the project or data set is being processed by the session pool 102, the capacity of each worker node, and the time designated for the session pool 102 to complete the project. Each worker node within the session pool 102 may be connected (wired or wirelessly, and directly or indirectly) to pool manager 104. Therefore, each worker node may receive information from the pool manager 104 (e.g., an instruction to perform work on a project) and may transmit information to the pool manager 104 (e.g., a result from work performed on a project). Furthermore, worker nodes 110 may communicate with each other (either directly or indirectly). For example, worker nodes 110 may transmit data between each other related to a job being performed or an individual task within a job being performed by that worker node. However, in certain embodiments, worker nodes 110 may not, for example, be connected (communicatively or otherwise) to certain other worker nodes. In an embodiment, worker nodes may only be able to communicate with the pool manager 104 that controls it and may not be able to communicate with other worker nodes in the session pool 102.

The pool manager 104 may connect with other devices of network 100 or an external device (e.g., a pool user, such as a server or computer). For example, a server or computer may connect to pool manager 104 and may transmit a project or job to the node. The project may include a data set. The data set may be of any size. Once the pool manager 104 receives such a project including a large data set, the pool manager 104 may distribute the data set or projects related to the data set to be performed by worker nodes 110. Alternatively, for a project including a large data set, the data set may be received or stored by a machine other than a pool manager 104 or worker node 110 (e.g., a Hadoop data node).

Pool manager may maintain knowledge of the status of the worker nodes 110 in the session pool 102 (i.e., status information), accept work requests from clients, subdivide the work across worker nodes 110, and coordinate the worker nodes 110, among other responsibilities. Worker nodes 110 may accept work requests from a pool manager 104 and provide the pool manager 104 with results of the work performed by the worker nodes 110. A session pool 102 may be started from a single node (e.g., a machine, computer, server, etc.). This first node may be assigned or may start as the primary pool manager 104 that will control any additional nodes that enter the session pool 102.

When a project is submitted for execution (e.g., by a client or a pool manger 104), it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A pool manager may be designated as the primary pool manager among multiple pool managers. A server, computer or other external device may connect to the primary pool manager. Once the pool manager receives a project, the primary pool manager may distribute portions of the project to its worker nodes for execution. For example, when a project is initiated on session pool 102, primary pool manager 104 controls the work to be performed for the project to complete the project as requested or instructed. The primary pool manager may distribute work to the worker nodes 110 based on various factors, such as which subsets or portions of projects may be completed most efficiently and in the correct amount of time. For example, a worker node may perform analysis on a portion of data that is already local (e.g., stored on) the worker node. The primary pool manager also coordinates and processes the results of the work performed by each worker node after each worker node executes and completes its job. For example, the primary pool manager may receive a result from one or more worker nodes, and the pool manager may organize (e.g., collect and assemble) the results received and compile them to produce a complete result for the project received from the end user.

Any remaining pool manager (not shown) may be assigned as backup pool manager for the project. In an embodiment, backup pool manager may not control any portion of the project. Instead, backup pool manager may serve as a backup for the primary pool manager and take over as primary pool manager if the primary pool manager were to fail.

To add another node or machine to the session pool 102, the primary pool manager may open a pair of listening sockets, for example. A socket may be used to accept work requests from clients, and the second socket may be used to accept connections from other pool nodes. The primary pool manager may be provided with a list of other nodes (e.g., other machines, computers, servers) that will participate in the pool, and the role that each node will fill in the pool. Upon startup of the primary pool manager (e.g., the first node on the pool), the primary pool manager may use a network protocol to start the server process on every other node in the session pool 102. Command line parameters, for example, may inform each node of one or more pieces of information, such as: the role that the node will have in the pool, the host name of the primary pool manager, and the port number on which the primary pool manager is accepting connections from peer nodes. The information may also be provided in a configuration file, transmitted over a secure shell tunnel, and recovered from a configuration server. While the other machines in the pool may not initially know about the configuration of the pool, that information may also be sent to each other node by the primary pool manager. Updates of the pool information may also be subsequently sent to those nodes.

For any pool manager other than the primary pool manager added to the pool, the pool manager may open multiple sockets. For example, the first socket may accept work requests from clients, the second socket may accept connections from other pool members, and the third socket may connect (e.g., permanently) to the primary pool manager. When a pool manager (e.g., primary pool manager) receives a connection from another pool manager, it first checks to see if the peer node is in the list of configured nodes in the pool. If it is not on the list, the pool manager may clear the connection. If it is on the list, it may then attempt to authenticate the connection. If authentication is successful, the authenticating node may transmit information to its peer, such as the port number on which a node is listening for connections, the host name of the node, and information about how to authenticate the node, among other information. When a node, such as the new pool manager, receives information about another active node, it will check to see if it already has a connection to that other node. If it does not have a connection to that node, it may then establish a connection to that pool manager.

Any worker node added to the pool may establish a connection to the primary pool manager and any other pool manager on the pool. After establishing the connection, it may authenticate itself to the pool (e.g., any pool manager, including both primary and backup, or a server or user controlling the pool). After successful authentication, the worker node may accept configuration information from the pool manager.

When a node joins a session pool 102 (e.g., when the node is powered on or connected to an existing node on the pool or both), the node is assigned (e.g., by an operating system of the pool) an identifier (e.g., a universally unique identifier (UUID)). This identifier may help other nodes and external entities (devices, users, etc.) to identify the node and distinguish it from other nodes. When a node is connected to the pool, the node may share its identifier with the other nodes in the pool. Since each node may share its identifier, each node may know the identifier of every other node on the pool. Identifiers may also designate a hierarchy of each of the nodes (e.g., backup pool manager) within the pool. For example, the identifiers of each of the backup pool manager may be stored in a list of backup pool manager to indicate an order in which the backup pool manager will take over for a failed primary pool manager to become a new primary pool manager. However, a hierarchy of nodes may also be determined using methods other than using the unique identifiers of the nodes. For example, the hierarchy may be predetermined, or may be assigned based on other predetermined factors.

The pool may add new machines at any time (e.g., initiated from any pool manager). Upon adding a new node to the pool, the pool manager may first add the new node to its table of pool nodes. The pool manager may also then notify every other pool manager about the new node. The nodes receiving the notification may acknowledge that they have updated their configuration information.

Primary pool manager 104 may, for example, transmit one or more communications to backup pool manager or other control or worker nodes within the session pool 102). Such communications may be sent using protocols such as periodically, at fixed time intervals, or between known fixed stages of the project's execution. The communications transmitted by primary pool manager 104 may be of varied types and may include a variety of types of information. For example, primary pool manager 104 may transmit snapshots (e.g., status information) of the session pool 102 so that backup pool manager 104 always has a recent snapshot of the session pool 102. The snapshot or pool status may include, for example, the structure of the pool (including, for example, the worker nodes in the pool, unique identifiers of the nodes, or their relationships with the primary pool manager) and the status of a project (including, for example, the status of each worker node's portion of the project). The snapshot may also include analysis or results received from worker nodes in the session pool 102. The backup pool manager may receive and store the backup data received from the primary pool manager. The backup pool manager may transmit a request for such a snapshot (or other information) from the primary pool manager, or the primary pool manager may send such information periodically to the backup pool manager.

As noted, the backup data may allow the backup pool manager to take over as primary pool manager if the primary pool manager fails without requiring the pool to start the project over from scratch. If the primary pool manager fails, the backup pool manager that will take over as primary pool manager may retrieve the most recent version of the snapshot received from the primary pool manager and use the snapshot to continue the project from the stage of the project indicated by the backup data. This may prevent failure of the project as a whole.

A backup pool manager may use various methods to determine that the primary pool manager has failed. In one example of such a method, the primary pool manager may transmit (e.g., periodically) a communication to the backup pool manager that indicates that the primary pool manager is working and has not failed, such as a heartbeat communication. The backup pool manager may determine that the primary pool manager has failed if the backup pool manager has not received a heartbeat communication for a certain predetermined period of time. Alternatively, a backup pool manager may also receive a communication from the primary pool manager itself (before it failed) or from a worker node that the primary pool manager has failed, for example because the primary pool manager has failed to communicate with the worker node.

Different methods may be performed to determine which backup pool manager of a set of backup pool manager will take over for failed primary pool manager 104 and become the new primary pool manager. For example, the new primary pool manager may be chosen based on a ranking or "hierarchy" of backup pool manager based on their unique identifiers. In an alternative embodiment, a backup pool manager may be assigned to be the new primary pool manager by another device in the session pool 102 or from an external device (e.g., a system infrastructure or an end user, such as a server or computer, controlling the session pool 102). In another alternative embodiment, the backup pool manager that takes over as the new primary pool manager may be designated based on bandwidth or other statistics about the session pool 102.

A worker node within the session pool 102 may also fail. If a worker node fails, work being performed by the failed worker node may be redistributed amongst the operational worker nodes. In an alternative embodiment, the primary pool manager may transmit a communication to each of the operable worker nodes still on the session pool 102 that each of the worker nodes should purposefully fail also. After each of the worker nodes fail, they may each retrieve their most recent saved checkpoint of their status and re-start the project from that checkpoint to minimize lost progress on the project being executed.

Figure 2:
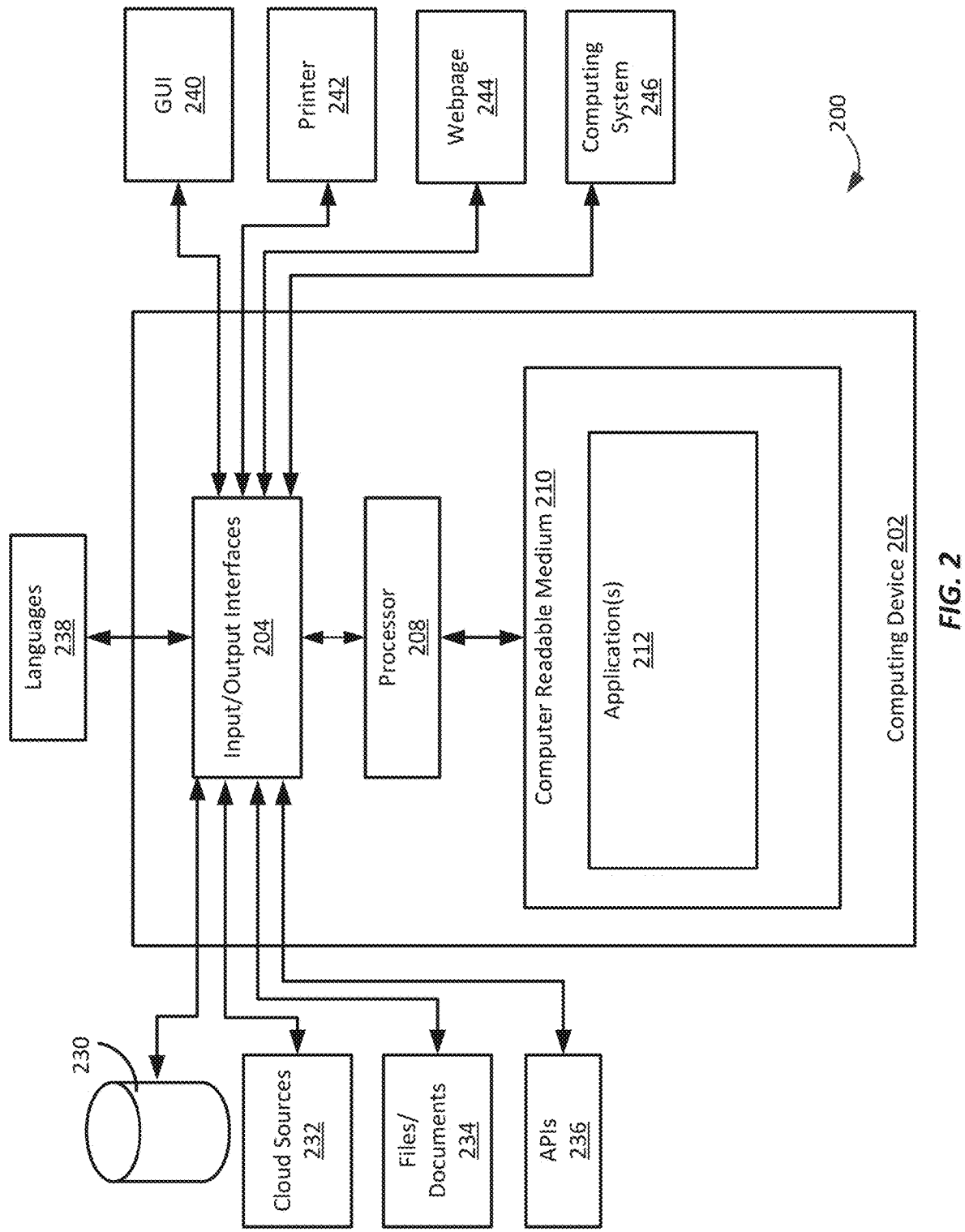
FIG. 2 illustrates a block diagram that provides an illustration of the hardware components of a computing system according to at least one embodiment of the present technology.

While each device in FIG. 1 is shown as a single device, it will be appreciated that multiple devices may instead be used. FIG. 2 shows an example computing structure for a device in FIG. 1. FIG. 2 includes a computing device 202. The computing device 202 has a computer-readable medium 210 and a processor 208. Computer-readable medium 210 is an electronic holding place or storage for information so the information can be accessed by processor 208. The computer readable medium 210 is a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including, for example, memory sharing, message passing, token passing, and network transmission. Computer-readable medium 210 can include, but is not limited to, any type of random-access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 208 executes instructions (e.g., stored at the computer-readable medium 210). The instructions can be carried out by a special purpose computer, logic circuits, or hardware circuits. In one or more embodiments, processor 208 is implemented in hardware and/or firmware. Processor 208 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 208 in one or more embodiments can retrieve a set of instructions from a permanent memory device and copy the instructions in an executable form to a temporary memory device that is generally some form of RAM, for example.

Processor 208 operably couples with components of computing device 202 (e.g., input/output interface 204 and with computer readable medium 210) to receive, to send, and to process information.

For instance, in one or more embodiments, computing device 202 sends and/or receives information from one or more of databases 230, cloud sources 232, application programming interfaces 236 (API's), graphical user interfaces 240 (GUIs), printers 242, webpages 244, and computing systems 246. The input/output interface 204 may be configured to receive languages 238 (e.g., to communicate with other computing systems 246) or specific electronic files or documents 234 (e.g., inputs for building models or designing experiments). The input/output interface 204 may be a single interface (e.g., an output interface only to output reports to a printer 242), multiple interface (e.g., a graphical user interface 240 may be interactive and send and receive data over input/output interface 204), or a set of interfaces (e.g., to connect with multiple devices).

In one or more embodiments, computer-readable medium 210 stores instructions for execution by processor 208. In one or more embodiments, one or more applications stored on computer-readable medium 210 are implemented in software (e.g., computer-readable and/or computer-executable instructions) stored in computer-readable medium 210 and accessible by processor 208 for execution of the instructions.

Figure 3:
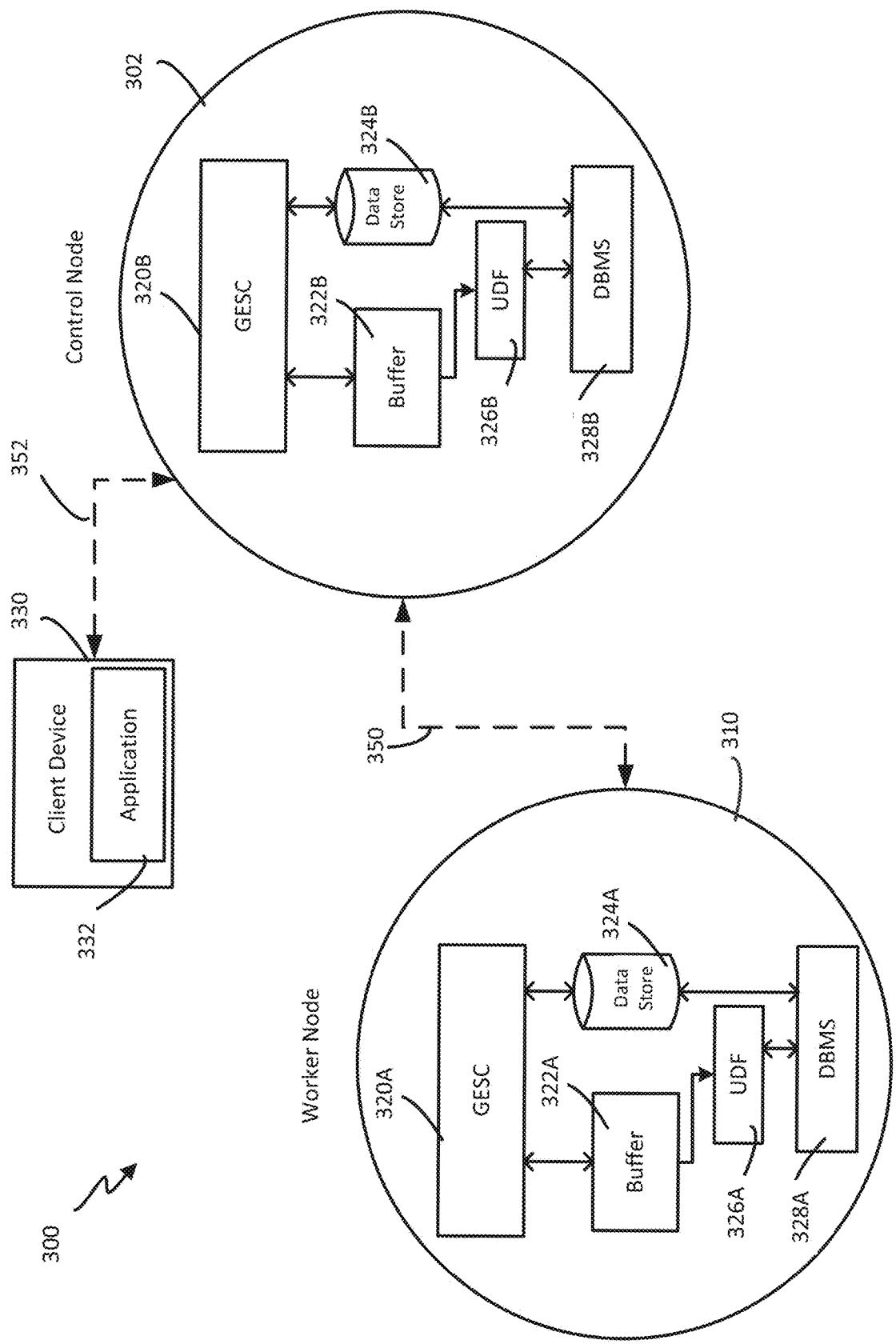
FIG. 3 illustrates a portion of a communications grid computing system, including a control node and a worker node, according to at least one embodiment of the present technology.

FIG. 3 illustrates a system 300 including a control node (e.g., pool manager 104 of FIG. 1) and a worker node (e.g., worker nodes 110 of FIG. 1), according to embodiments of the present technology. System 300 includes one control node (control node 302) and one worker node (worker node 310) for purposes of illustration but may include more worker and/or control node. The control node 302 is communicatively connected to worker node 310 via communication path 350. Therefore, control node 302 may transmit information (e.g., related to the session pool 102 or notifications), to and receive information from worker node 310 via path 350.

System 300 includes data processing nodes (e.g., control node 302 and worker node 310). Control node 302 and worker node 310 can include multi-core data processors. Each control node 302 and worker node 310 in this example includes a grid-enabled software component (GESC) 320 that executes on the data processor associated with that node and interfaces with buffer memory 322 also associated with that node. Each control node 302 and worker node 310 in this example includes a database management software (DBMS) 328 that executes on a database server (not shown) at control node 302 and on a database server (not shown) at worker node 310.

Each control node 302 and worker node 310 in this example also includes a data storage 324. Data storage 324, similar to network-attached data stores 120 in FIG. 1, are used to store data to be processed by the nodes in the computing environment. Data storage 324 may also store any intermediate or final data generated by the computing system after being processed, for example in non-volatile memory. However, in certain embodiments, the configuration of the system 300 allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the pool receives queries (e.g., ad hoc) from a client device 330 and when responses, which are generated by processing large amounts of data, need to be generated quickly or on-the-fly. In such a situation, the pool may be configured to retain the data within memory so that responses can be generated at different levels of detail and so that a client may interactively query against this information.

Each control node 302 and worker node 310 in this example also includes a user-defined function (UDF) 326. The UDF 326 provides a mechanism for the DBMS 328 to transfer data to or receive data from the database stored in the data storage 324 that are managed by the DBMS. For example, UDF 326 can be invoked by the DBMS 328 to provide data to the GESC 320 for processing. The UDF 326 may establish a socket connection (not shown) with the GESC 320 to transfer the data. Alternatively, the UDF 326 can transfer data to the GESC 320 by writing data to shared memory accessible by both the UDF 326 and the GESC 320.

The GESC 320 at the control node 302 and worker node 310 may be connected via a network. Therefore, control node 302 and worker node 310 can communicate with each other via the network using a predetermined communication protocol such as, for example, the Message Passing Interface (MPI). Each GESC 320 can engage in point-to-point communication with the GESC at another node or in collective communication with multiple GESCs via the network. The GESC 320 at each node may contain identical (or nearly identical) software instructions. Each control node 302 and worker node 310 may be configured to operate as either a pool manager or a worker node. The GESC 320B at the control node 302 can communicate, over a communication path 352, with a client device 330. More specifically, control node 302 may communicate with client application 332 hosted by the client device 330 to receive queries and to respond to those queries after processing large amounts of data.

DBMS 328 may control the creation, maintenance, and use of database or data structure (not shown) within control node 302 and worker node 310. The database may organize data stored in data storage 324. The DBMS 328 at control node 302 may accept requests for data and transfer the appropriate data for the request. With such a process, collections of data may be distributed across multiple physical locations. In this example, each control node 302 and worker node 310 stores a portion of the total data managed by the management system in its associated data storage 324.

Furthermore, the DBMS 328 may be responsible for protecting against data loss using replication techniques. Replication includes providing a backup copy of data stored on one node on one or more other nodes. Therefore, if one node fails, the data from the failed node can be recovered from a replicated copy residing at another node. Data or status information for each node in the session pool 102 may also be shared with each node on the pool.

Figure 4:
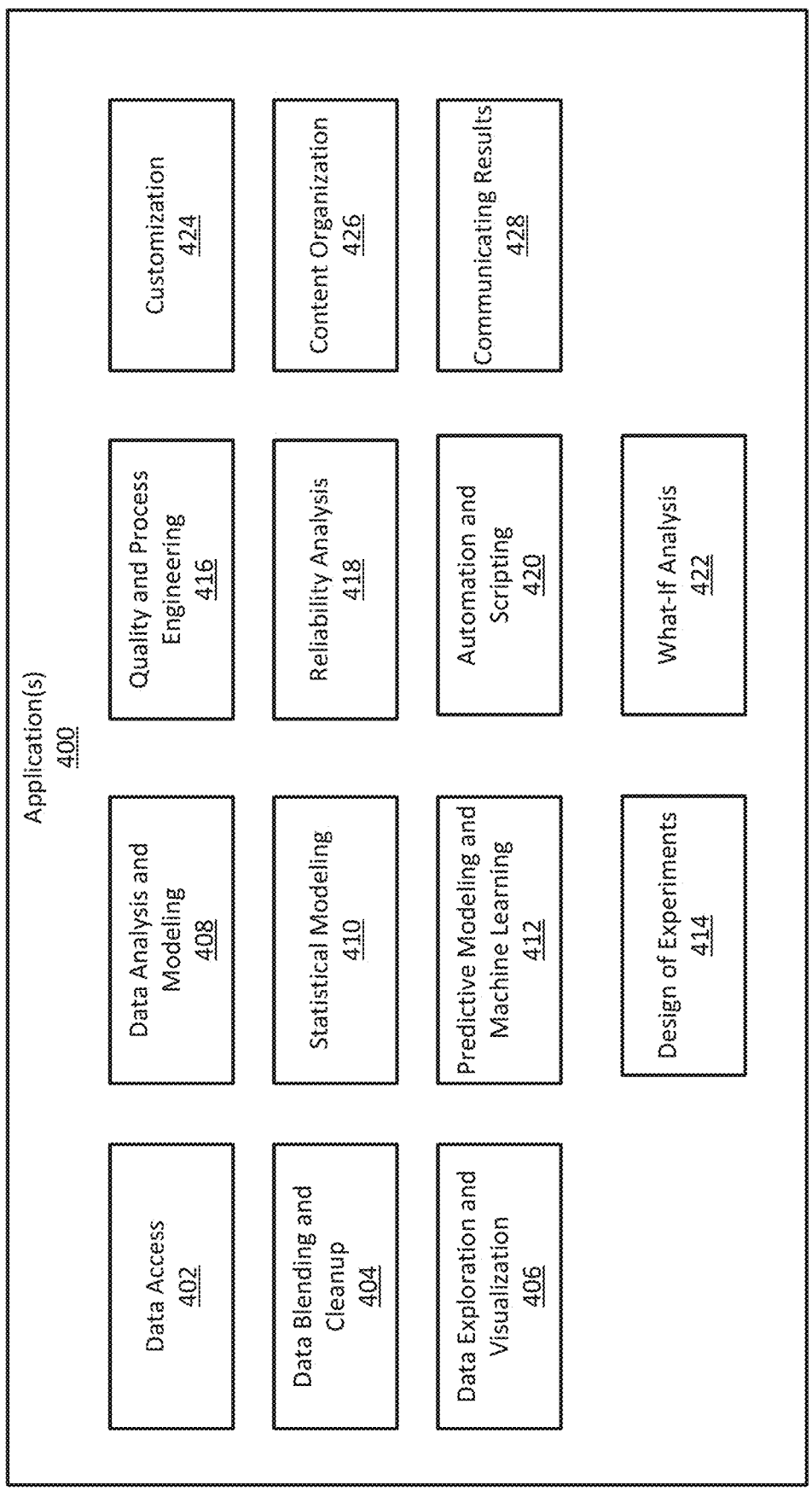
FIG. 4 illustrates a block diagram of example applications according to at least one embodiment of the present technology

FIG. 4 provides example applications 400 (e.g., applications executed by a computing device 202, worker node 310, or control node 302) for performing one or more tasks or operations.

For example, data access operations 402 can be used for accessing data from different sources (e.g., importing and/or reading Excel files, flat files, relational databases, APIs, R, Python, and SAS® files and databases). For instance, data can be imported for data visualization, exploration and analysis. Data can be formatted or optimized. For instance, data blending and cleanup operations 404 can be used to remove complexity (e.g., in text, images and functions data) and for screening data (e.g., screening data for outliers, entry errors, missing values and other inconsistencies that can compromise data analysis). This can be useful for visual and interactive tools. Data can also be transformed, blended, grouped, filtered, merged into a single table or into subsets, or otherwise arranged for a particular scenario.

In one or more embodiments, one or more applications 400 include data exploration and visualization operations 406 that can be used to support plot and profiler tools. For instance, plot tools can be used to create data plots (e.g., to plot data to spot patterns and patterns that do not fit a trend). Some example plots include bubble plots, scatter plots (matrix and 3D), parallel plots, cell plots, contour plots, ternary plots, and surface plots. Profilers are tools that can be used to create a specialized set of plots in which changing one plot changes the other plots. For instance, profiling is an approach to generate visualizations of response surfaces by seeing what would happen if a user changed just one or two factors at a time. Profiler tools can be used to create interactive profiles of data (e.g., to explore and graph data dynamically and uncover hidden relationships between graphed data or interface with linked data, to interpret and understand the fit of equations to data, and to find factor values to optimize responses). Some example profiler tools include prediction profiler, contour profiler, surface profiler, mixture profiler, custom profiler, and excel profiler. A prediction profiler can be used to show vertical slices across each factor, holding other factors at a current value. A contour profiler allows horizontal slices showing contour lines for two factors at a time. A surface profiler generates three-dimensional plots for two factors at a time, or contour surface plot for 3 factors at a time. A mixture profiler is a contour profiler for mixture of factors. A custom profiler is a numerical optimizer. An excel profiler allows for visualization of models or formulas stored in electronic worksheets. Accordingly, profiler tools can allow for one or more of simulation, surface visualization, optimization, and desirability studies. Graphs (e.g., from plot or profiler tools) can be exported to electronic or print reports for presenting findings. Further, data exploration and visualization operations 406 can include text exploration such as computer extraction of symbols, characters, words and phrases; or computer visualization such as to organize symbols, characters, words and phrases to uncover information regarding a text or classify the text.

In one or more embodiments, one or more applications 400 include data analysis and modeling operations 408 can be used to analyze one or many variables or factors in linked analysis. Analysis results may be linked with specific graphs designed for different types of data or metrics (e.g., graphs related to histograms, regression modeling and distribution fitting). Data analysis and modeling can be performed real-time (or just-in-time). For instance, applications 400 can included statistical modeling operations 410. For instance, statistical modeling operations 410 can be used for a diversity of modeling tasks such as univariate, multivariate and multifactor. Data can be transformed from its collected form (e.g., text or functional form) and data can be used for building models for better insights (e.g., discovery trends or pattens in data). As another example, one or more applications 400 can include predictive modeling and machine learning operations 412 to build models using predictive modeling techniques, such as regression, neural networks and decision trees. The operations 412 can be used to fit multiple predictive models and determine the best performing model with model screening. Validation (e.g., cross-validation and k-fold cross-validation) can be used (e.g., to prevent over-fitting or to select a best model). Machine learning methods can be used by the user without having to write code and tune algorithms. Examples of machine learning techniques are described in more detail with respect to FIGS. 5 and 6).

In one or more embodiments, one or more applications 400 include design of experiments (DOE) operations 414 used to create designs for experiments that provide test conditions for one or more factors tested in the experiment. For example, the design of experiments operations 414 can be used to create optimally designed experiments, efficient experiments to meet constraints, process limitations and budget, and/or screening designs to untangle important effects between multiple factors. DOE operations 414 can also be used for evaluating designs (e.g., design diagnostic measures such as efficiency metrics).

In one or more embodiments, one or more applications 400 include quality and process engineering operations 416 to track and visualize quality and processes. For instance, the quality and process engineering operations 416 can generate charts to explore root causes of quality or process problems (e.g., causes of variation in manufacturing processes and drill down into problem processes). Additionally, or alternatively, they can be used to generate notifications for metrics that exceed a threshold such as an out-of-control signal or a control chart warning. Additionally, or alternatively, they can be used to study the capability and performance of one or more variables to identify processes that are not meeting user-defined goals. Objective data from processes or consumer data can be used to release better products and react to market trends.

In one or more embodiments, one or more applications 400 include reliability analysis operations 418. For example, in manufacturing, reliability analysis tools can be used to prevent failure, improve warranty or product performance, find and address important design vulnerabilities, and pinpoint defects in materials or processes. Reliability analysis tools can also be used to determine how to reduce or improve these issues (e.g., by identifying trends and outliers in data and model predictions). What-if Analysis operations 422 can be used to demonstrate patterns of predicted responses and the effect of each factor on the response with scenario analysis. For example, a graphical user interface can be used for a user to put in different inputs, assumptions or constraints for a system and observe responses or effects. For instance, in a measurement system analysis analyzing whether parts would be in-specification, different estimated variances between parts and operators testing the parts could be varied to determine the effect on modeled output for the measurement system analysis.

In one or more embodiments, one or more applications 400 include automation and scripting operations 420. For example, automation can allow code-free access for a user to automation routines all the way up to completely customized applications (e.g., code free access to SAS®, MATLAB®, Python® and R routines). For example, a design created for experiments can be automated such that automatic testing is performed for the design.

In one or more embodiments, one or more applications 400 include operations for greater user control and interaction. For instance, customization operations 424 can be used for user customization (e.g., mass customizations, and customizations of graphics, statistics, and default views). As another example, content organization operations 426 can be used to organize data (e.g., translate statistical results to a simplified view to communicate findings and organize, summarize, and document content to better aid the accountability and reproducibility of projects). As another example, the communicating results operations 428 can be used for presentation of results, models, or other output from one or more applications 400 (e.g., presented in print, graphical user interface, or web-based versions).

In one or more embodiments, fewer, different, and additional components can be incorporated into computing device 202. In one or more embodiments, the input/output interface has more than one interface that uses the same or different interface technology.

In one or more embodiments, the one or more applications 400 can be integrated with other analytic or computing tools not specifically shown here. For instance, one or more applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®.

Figure 5:
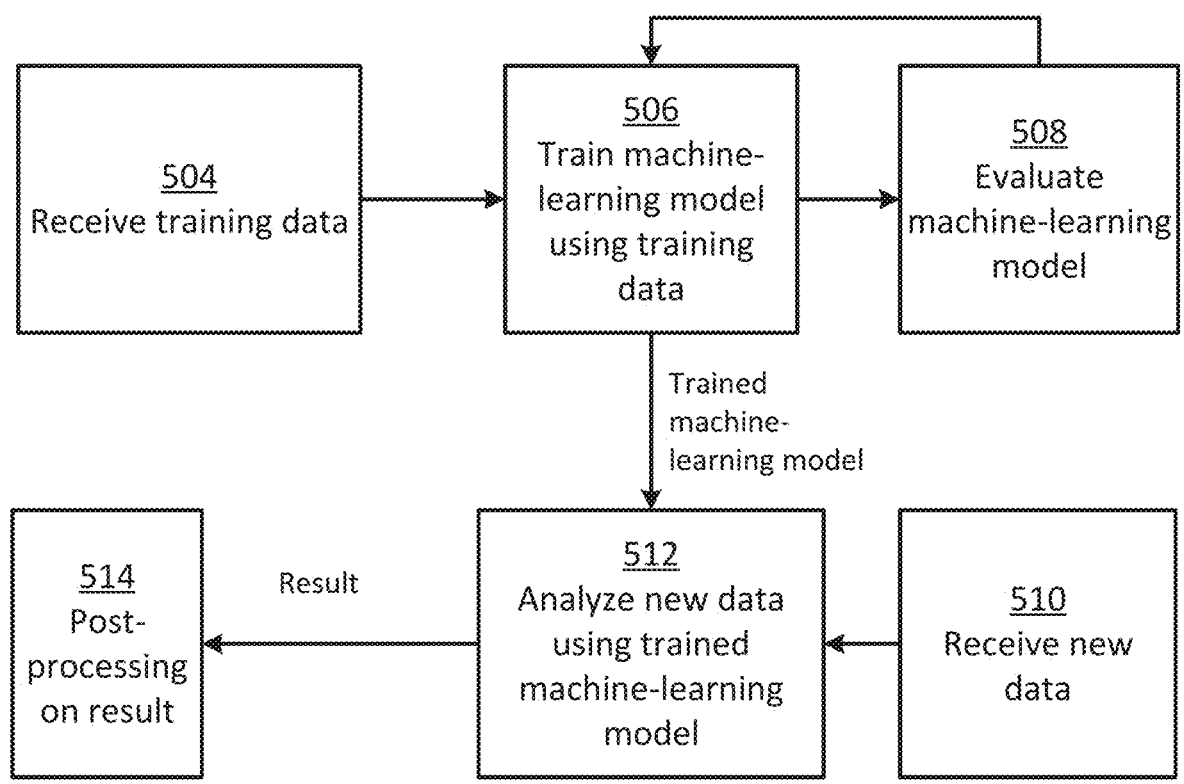
FIG. 5 illustrates a flow chart of an example of a process for generating and using a machine-learning model according to at least one embodiment of the present technology.

One or more embodiments are useful for generating and using machine-learning models. FIG. 5 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector operator (LASSO) classifiers, and support vector machines; (iv) clusterers, such as k-means clustering, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models construction can be at least partially automated (e.g., with little or no human involvement) in a training process. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 5.

In block 504, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 506, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 508, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 506, where the machine-learning model can be further trained using additional training data or otherwise modified to improve accuracy. If the machine-learning model has an adequate degree of accuracy for the particular task, the process can continue to block 510.

In block 510, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 512, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 514, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 6:
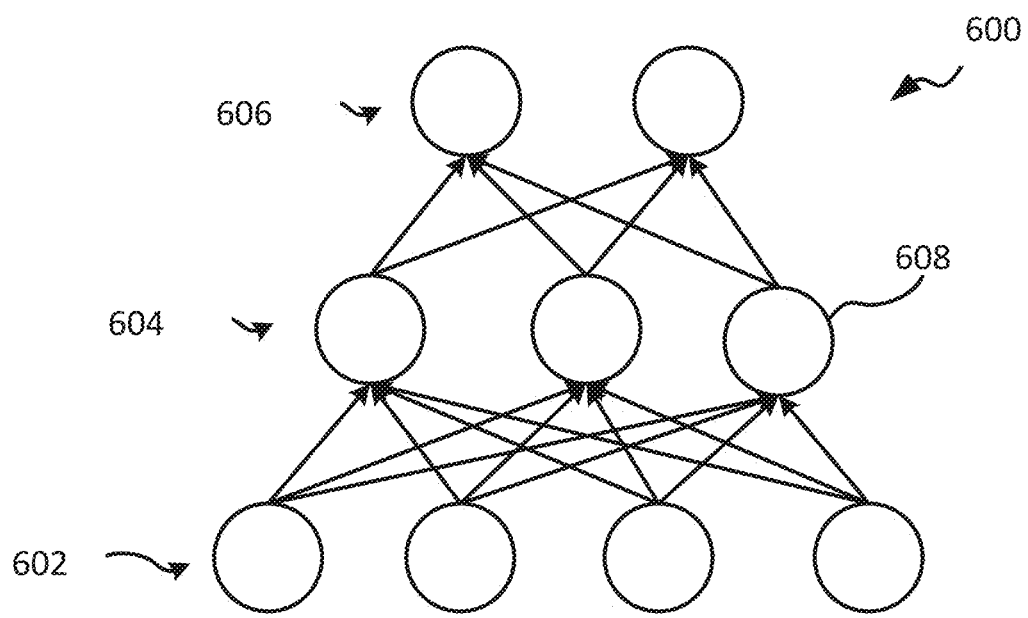
FIG. 6 illustrates an example of a machine-learning model as a neural network according to at least one embodiment of the present technology.

A more specific example of a machine-learning model is the neural network 600 shown in FIG. 6. The neural network 600 is represented as multiple layers of interconnected neurons, such as neuron 608, that can exchange data between one another. The layers include an input layer 602 for receiving input data, a hidden layer 604, and an output layer 606 for providing a result. The hidden layer 604 is referred to as hidden because it may not be directly observable or have its input directly accessible during the normal functioning of the neural network 600. Although the neural network 600 is shown as having a specific number of layers and neurons for exemplary purposes, the neural network 600 can have any number and combination of layers, and each layer can have any number and combination of neurons.

The neurons and connections between the neurons can have numeric weights, which can be tuned during training. For example, training data can be provided to the input layer 602 of the neural network 600, and the neural network 600 can use the training data to tune one or more numeric weights of the neural network 600. In some examples, the neural network 600 can be trained using backpropagation. Backpropagation can include determining a gradient of a particular numeric weight based on a difference between an actual output of the neural network 600 and a desired output of the neural network 600. Based on the gradient, one or more numeric weights of the neural network 600 can be updated to reduce the difference, thereby increasing the accuracy of the neural network 600. This process can be repeated multiple times to train the neural network 600. For example, this process can be repeated hundreds or thousands of times to train the neural network 600.

In some examples, the neural network 600 is a feed-forward neural network. In a feed-forward neural network, every neuron only propagates an output value to a subsequent layer of the neural network 600. For example, data may only move one direction (forward) from one neuron to the next neuron in a feed-forward neural network.

In other examples, the neural network 600 is a recurrent neural network. A recurrent neural network can include one or more feedback loops, allowing data to propagate in both forward and backward through the neural network 600. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 600 operates by receiving a vector of numbers from one layer; transforming the vector of numbers into a new vector of numbers using a matrix of numeric weights, a nonlinearity, or both; and providing the new vector of numbers to a subsequent layer of the neural network 600. Each subsequent layer of the neural network 600 can repeat this process until the neural network 600 outputs a final result at the output layer 606. For example, the neural network 600 can receive a vector of numbers as an input at the input layer 602. The neural network 600 can multiply the vector of numbers by a matrix of numeric weights to determine a weighted vector. The matrix of numeric weights can be tuned during the training of the neural network 600. The neural network 600 can transform the weighted vector using a nonlinearity, such as a sigmoid tangent or the hyperbolic tangent. In some examples, the nonlinearity can include a rectified linear unit, which can be expressed using the following equation:

$$y = \max(x, 0)$$

where y is the output and x is an input value from the weighted vector. The transformed output can be supplied to a subsequent layer, such as the hidden layer 604 of the neural network 600. The subsequent layer of the neural network 600 can receive the transformed output, multiply the transformed output by a matrix of numeric weights and a nonlinearity, and provide the result to yet another layer of the neural network 600. This process continues until the neural network 600 outputs a final result at the output layer 606.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the session pool 102 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, chip-level thermal processing considerations, processing speed improvements, data communication speed improvements, and/or data efficiency targets and improvements throughout various parts of the system when compared to a homogeneous computing architecture that employs CPUs for general purpose computing.

Often when designing and conducting experiments, factors are intended to be crossed with one another in a full factorial design. That is, every level of one factor is paired with every level of another factor, so that all possible combinations appear in the design. This may only partially happen in fractional-factorial or even optimal designs. To illustrate, consider a design for a measurement systems analysis where 3 operators are tasked with measuring 10 parts with 2 instruments. In a fully crossed design, each operator would measure every part with every instrument, repeatedly if the design is replicated multiple times. If the design is not a full factorial, perhaps due to economic constraints on the number of runs required, it could still be considered crossed if each operator had the complete combination of parts and instruments available to pull from when generating the design even if the final design does not have every combination.

In practice, circumstances such as physical constraints may arise that prevent a crossed design from being implemented. For example, suppose an experiment was to be conducted across 2 different sites, a long distance from each other. Attempting to conduct a fully crossed design would entail transporting operators, parts, and instruments from one site to the other. The goals of the experiment may be such that an alternative approach would be to have an equivalent number of operators, parts, and instruments conduct measurements at the other site, resulting in a total of 6 operators (3 at each site), 20 parts (10 at each site) and 4 instruments (2 at each site). This would be an example of a design in which some factors are nested within others, where nesting means that some of the levels of one or more factors can only be paired with one or more levels of another factor, but not all levels. In this example, the operator, part, and instrument factors are nested within the site factor since not every site can be paired with every other operator, part, and instrument.

A nesting design can refer, for example, to a design structure or design cases for a design that has at least one factor nested within another factor. Nesting designs can include some crossed factors. Nested designs are prevalent in measurement systems analysis, though they can occur in other fields as well. For instance, operators conducting an experiment may be nested within a particular lab in which they will conduct an experiment. One or more embodiments provide improvements for generating a nesting design and assessing that nesting design (e.g., coverage in the design or variability from different factors). Embodiments can avoid assigning options in particular design cases accounting for the nesting goals and can assess designs accounting for those intentional deviations from a crossed design.

Figure 7:
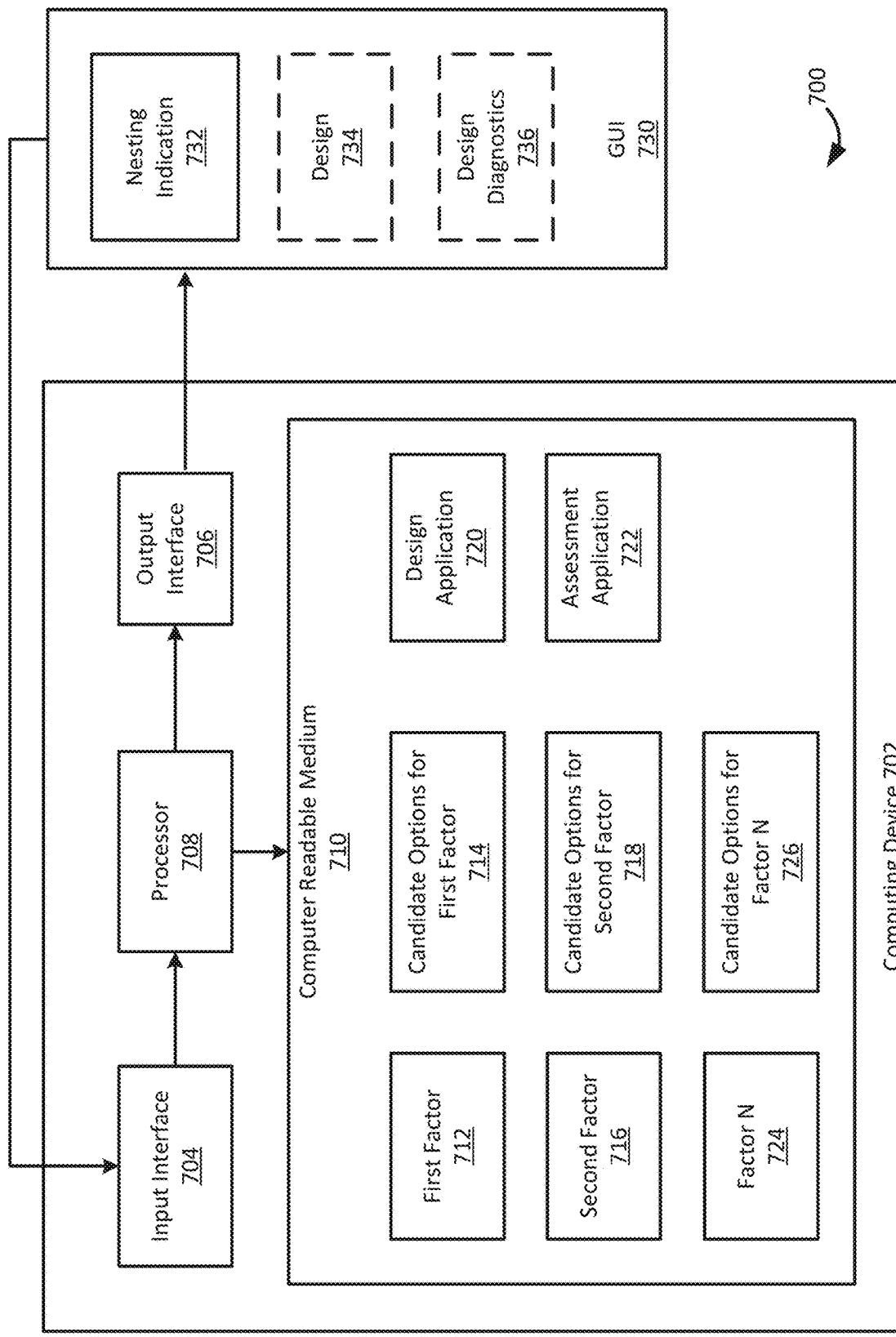
FIG. 7 illustrates a block diagram of a system for generating a nesting design and generating computer assessments according to at least one embodiment of the present technology.

FIG. 7 illustrates a block diagram of a system for generating a design (e.g., a nesting design) and generating computer assessments. System 700 includes a computing device 702. The computing device 702 is configured to exchange information between devices in the system (e.g., via wired and/or wireless transmission). For example, the computing device 702 includes an input interface 704 and an output interface 706 for sending and receiving information. A network (not shown) can connect one or more devices of system 700 to one or more other devices of system 700 (e.g., an input and/or output device such as a one displaying a graphical user interface 730, a printer, or storage device). Alternatively, or additionally, the system is integrated into one device (e.g., a touch screen of a tablet) and input interface 704 and output interface 706 are internal interfaces.

The computing device 702 has a computer-readable medium 710 and a processor 708. Computer-readable medium 710 is an electronic holding place or storage for information so the information can be accessed by processor 708. Computer-readable medium 710 can include, but is not limited to, any type of random access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc. For instance, computer-readable medium 710 can store information obtained by the computing device 702 (e.g., received from an input device in the system 700 such as one implementing a graphical user interface 730). For example, computer-readable medium 710 obtains a first factor 712 for a design (e.g., a nesting design) and first set of candidate options 714 for the first factor. The computer-readable medium 710 also obtains a second factor 716 for a design and a second set of candidate options 718 for the second factor. For example, if the experiment is an experiment to test take-off speed for different airplanes that take different fuel types, the first factor could be the airplane used with different options being the different airplanes and the second factor could be fuel with different options indicating possible fuel types for the different airplanes. Two factors are given merely for example. Additional factors could be nested or crossed with first factor 712 and/or second factor 716 (e.g., a Factor N 724). Additional factors could also have their own candidate options (e.g., Candidate options 726 for Factor N 724). The computing device 702 could obtain additional factors and options for storage in computer-readable medium 710. Further, each set of candidate options could comprise only one option or multiple options. For instance, an additional factor could be the volume of fuel used which could take on a range of options within the tank size.

The computer-readable medium 710 could obtain information such as the factors from another computing system not shown or could obtain the information pertaining to a design using graphical user interface 730 (e.g., graphical user interface interfaces shown in examples described herein). For instance, the input interface 704 can receive a nesting indication 732 indicating that a factor is nested within another factor or nesting another factor (e.g., that the second factor 716 is nested within the first factor 712). For example, the fuel type factor could be nested within the airplane factor because options for the fuel type are dependent on the airplane selected. Embodiments described herein advantageously allow a user to control a design (e.g., by dictating the factors, options for those factors, and structure of a design such as crossed or nested factors).

Computing device 702 includes a processor 708 that executes instructions (e.g., stored at the computer-readable medium 710). The instructions can be carried out by a special purpose computer, logic circuits, or hardware circuits. In one or more embodiments, processor 708 is implemented in hardware and/or firmware. Processor 708 executes an instruction, meaning it performs or controls the operations called for by that instruction. The term "execution" is the process of running an application or the carrying out of the operation called for by an instruction. The instructions can be written using one or more programming languages, scripting languages, assembly languages, etc. Processor 708 in one or more embodiments can retrieve a set of instructions from a permanent memory device and copy the instructions in an executable form to a temporary memory device that is generally some form of RAM, for example. Processor 708 operably couples with components of computing device 702 (e.g., input interface 704, with output interface 706 and with computer-readable medium 710) to receive, to send, and to process information.

In one or more embodiments, computer-readable medium 710 stores instructions for execution by processor 708. One or more applications stored on computer-readable medium 710 are implemented in software (e.g., computer-readable and/or computer-executable instructions) stored in computer-readable medium 710 and accessible by processor 708 for execution of the instructions.

For example, in one or more embodiments, the computer-readable medium 710 comprises instructions for a design application 720 for generating a design such as a nested or crossed design. Additionally, or alternatively, the computer-readable medium 710 comprises instructions for an assessment application 722.

For example, the design application 720 can be used to assign particular groups of options of one factor to groups of options in another factor (e.g., assigning one group of fuel types to one airplane type, and another group of fuel types to another airplane type). The design application 720 can then select based on the assignment of groups particular options for design cases of a design. The assessment application 722 may be used to generate one or more computer-generated assessments of a design (e.g., assessment of a nesting design created by design application 720). For instance, an assessment may use a computer simulation of a design to assess the design before implementing it. The assessment application 722 could be used to generate the computer simulation and/or control the computer simulation (e.g., determining terms for a computer model for the computer simulation). The computing system can generate one or more computer-generated assessments of the nesting design based on the computer simulation according to the computer model.

The one or more applications can be integrated with other analytic tools. Merely for illustration, the applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®.

The one or more applications stored on computer-readable medium 710 can be implemented as a Web application. For example, an application can be configured to receive hypertext transport protocol (HTTP) responses and to send HTTP requests. The HTTP responses may include web pages such as hypertext markup language (HTML) documents and linked objects generated in response to the HTTP requests. Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java applet, an extensible markup language (XML) file, or any other type of file supported by HTTP.

In one or more embodiments, fewer, different, or additional components can be incorporated into computing device 702. For instance, in one or more embodiments, there are multiple input devices or computing systems (e.g., one to obtain factors and/or options and one to obtain a nesting indication 732). In the same or different embodiments, there are multiple output devices or computing systems (e.g., one to display the graphical user interface 730 and one to receive a generated design or assessment).

As another example, the same interface supports both input interface 704 and output interface 706. For example, a touch screen provides a mechanism for user input and for presentation of output to the user. Alternatively, the input interface 704 has more than one input interface that uses the same or different interface technology. Alternatively, or additionally, the output interface 706 has more than one output interface that uses the same or different interface technology. In some embodiments the design application 720 and the assessment application 722 are combined into a single application.

Figure 8A:
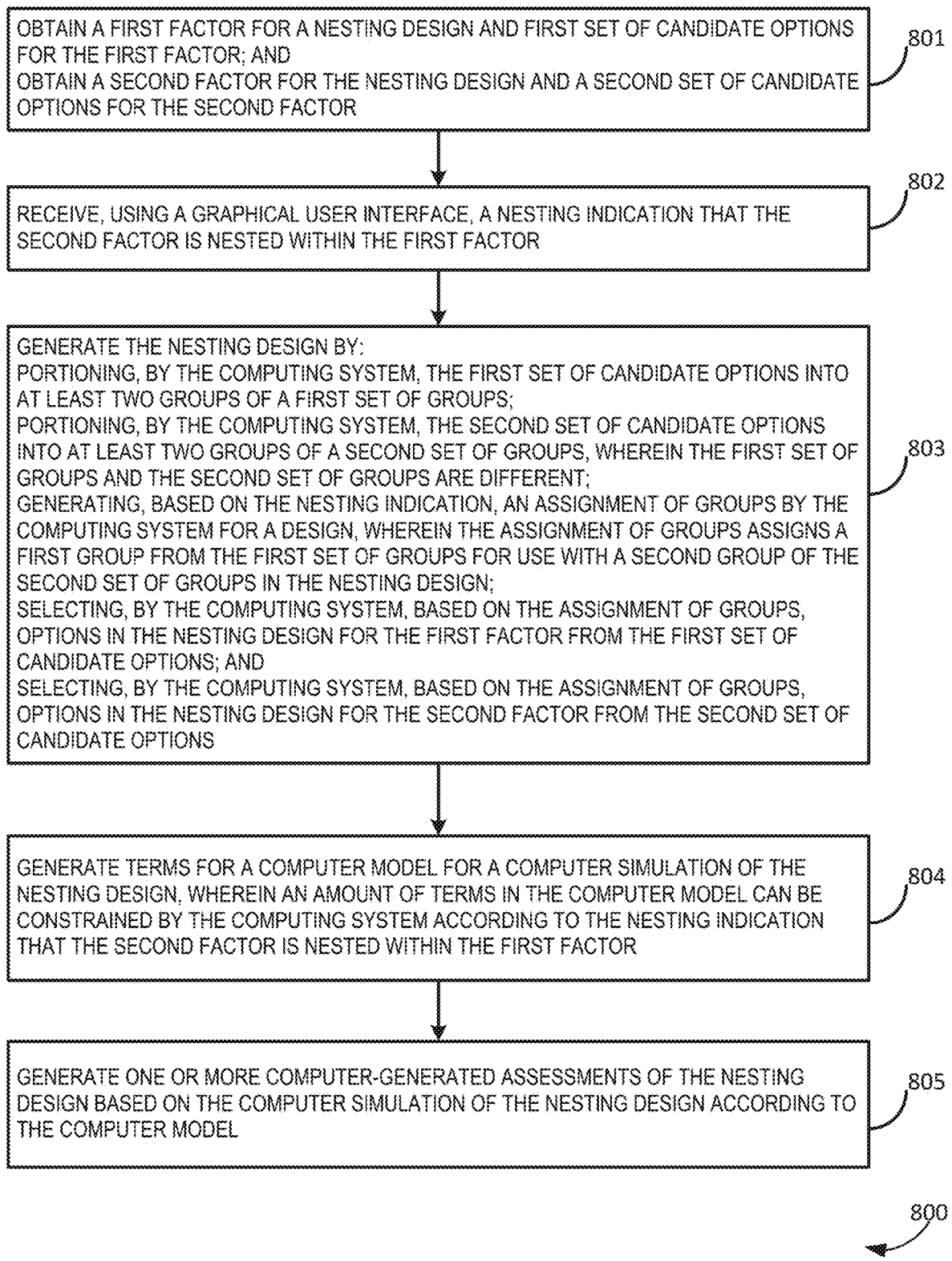
FIGS. 8A-8B illustrate flow diagrams for generating a nesting design and generating computer assessments according to at least one embodiment of the present technology.
Figure 8B:
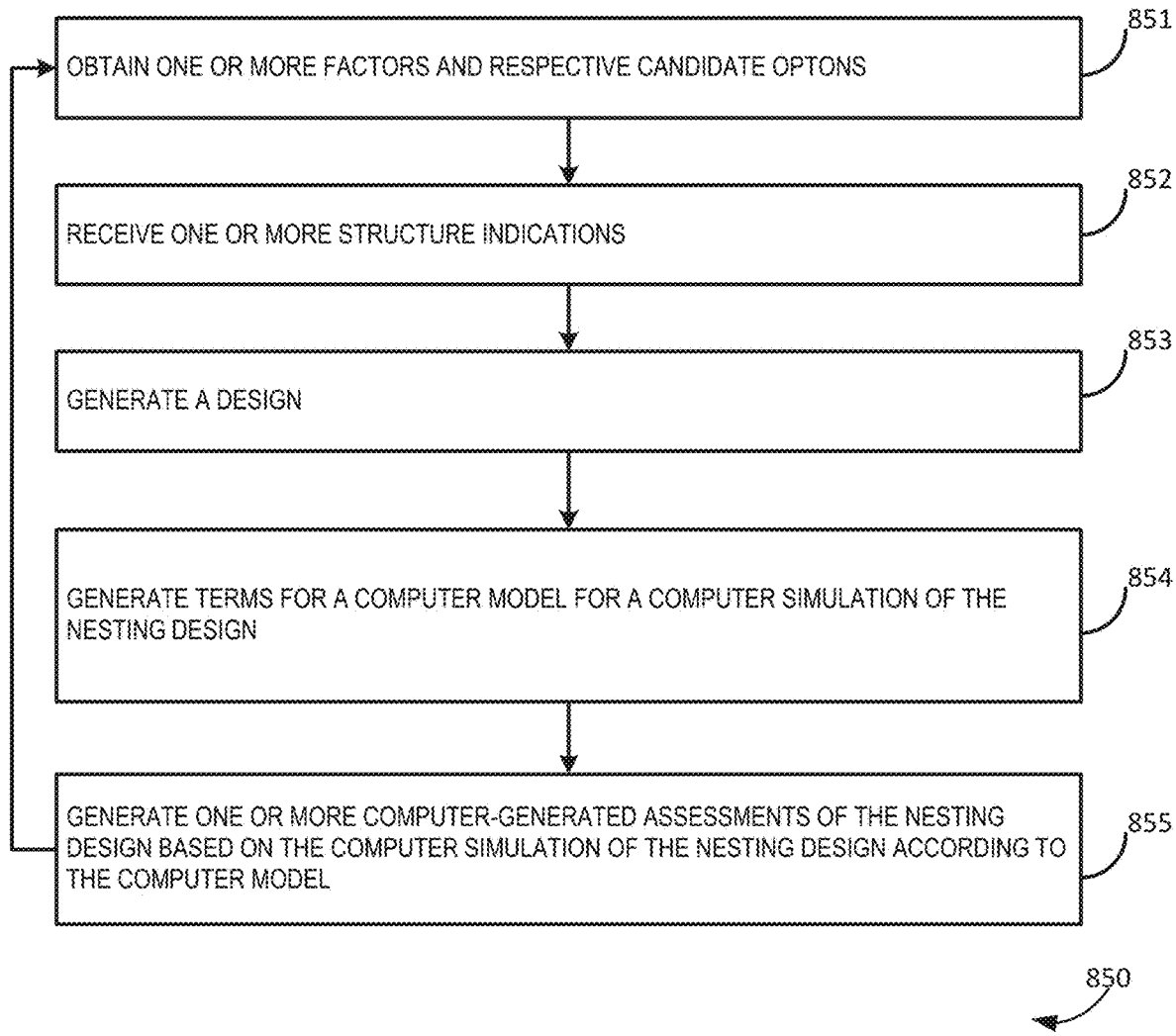

In one or more embodiments, a computing system (e.g., the system 700 or computing device 702) implements a method as described herein (e.g., a method shown in FIG. 8A or 8B).

FIG. 8A illustrates a flow diagram of a method 800 for generating a nesting design and generating computer assessments. An operation 801 of method 800 includes obtaining one or more factors for a nesting design. For instance, the method 800 can include obtaining a first factor for a nesting design and first set of candidate options for the first factor and obtaining a second factor for the nesting design and a second set of candidate options for the second factor. For example, if an experiment is conducted on mice, the experimenter may want to separate the mice into different broods. A first factor could be broods with options numbering the different broods and a second factor could be mice with options numbering the different family members within a brood. More or fewer factors can be obtained in different embodiments. For instance, additional factors could involve techniques or pharmaceuticals tested on the mice in the experiment.

An operation 802 of method 800 includes receiving, using a graphical user interface, a nesting indication that the second factor is nested within the first factor. For instance, the graphical user interface can be used to structurally represent the design in a graphical representation. For example, the researcher may want a brood factor nesting the mice factor so that the design represents that individual mice are kept within their same brood in the experiment.

An operation 803 of method 800 includes generating the nesting design. For instance, where there are two factors the computing system can portion the first set of candidate options into at least two groups of a first set of groups (e.g., different brood families). The computing system can portion the second set of candidate options into at least two groups of a second set of groups (e.g., different family members).

The first set of groups and the second set of groups are different. The computing system can generate, based on the nesting indication, an assignment of groups by the computing system for a design. The assignment of groups assigns a first group from the first set of groups for use with a second group of the second set of groups in the nesting design. For instance, family members 1-4 of brood 1 are assigned to brood 1 group and family members 1-4 of brood 2 are assigned to brood 2 group. The computing system then selects, based on the assignment of groups, options in the nesting design for the first factor from the first set of candidate options. The computing system may set up design cases and may decide the first 8 design cases will have brood 1 mice tested, and the next 8 design cases will have broad 2 mice tested (e.g., if the computing system has each family member replicated twice).

The computing system selects, based on the assignment of groups, options in the nesting design for the second factor from the second set of candidate options. For example, the options for assignment to a mice brood could be mice siblings born first, second, third and fourth. Because the options may be unique (e.g., a specific mouse of a specific age), the computing system can generate the assignment of groups such that any group from the first set of groups is only assigned one group from the second set of groups (i.e., mouse siblings are grouped and assigned to only one brood group), and generate a nesting design based on selecting options for the first factor from a first group of the first set of groups and selecting options for the second factor from a second group of the second set of groups assigned to the first group according to the assignment of groups.

An operation 804 of method 800 includes generating terms for a computer model for a computer simulation of the nesting design. An amount of terms (i.e., the number of those terms) in the computer model can be constrained by the computing system according to the nesting indication that the second factor is nested within the first factor. For instance, a crossed design may use additional terms such as interactions between factors to represent the potential behavior of factors in an experiment. By considering the nesting behavior, unnecessary terms can be excluded from the computer model (e.g., excluding terms related to interactions between a nesting and nested factors from other interaction terms). Additionally, or alternatively, different terms can be used (e.g., ones relevant to nesting factors).

An operation 805 of method 800 includes generating one or more computer-generated assessments of the nesting design based on the computer simulation of the nesting design according to the computer model. For instance, the computer-generated assessments could indicate a good coverage for the factors even though not all combinations will be tested given that the mice are separated in their broods according to the design for the experiment.

Operations described herein can be applied to more or fewer factors or applied iteratively based on changing factors to a design or improving assessments for a design. Operations described in method 800 can be repeated for additional factors.

For instance, FIG. 8B shows a method 850 with an operation 851 of obtaining one or more factors and respective candidate options (e.g., the first factor and second factor of FIG. 8A). Operation 852 of method 850 includes receiving one or more structure indications (e.g., the nesting indication described in operations 802 of FIG. 8A or other indications such as a cross indication). Operation 853 of method 850 includes generating a nesting design (e.g., using operations described with respect to operations 803 of FIG.

8A). Operation 854 of method 850 includes generating terms for a computer model for a computer simulation of the nesting design (e.g., using operations described with respect to operations 804 of FIG. 8A). Operation 855 of method 850 includes generating one or more computer-generated assessments of the nesting design based on the computer simulation of the nesting design according to the computer model (e.g., using operations described with respect to operations 804 of FIG. 8A).

Operations can be repeated for additional factors. For instance, a computing system can use an operation 851 to obtain a third factor and a third set of candidate options for the third factor. In operation 852, the computing system can receive a subsequent indication. That subsequent indication could be that the third factor is nested within the second factor. Additionally, or alternatively, the subsequent indication could be a different relationship such as that the third factor is crossed with one or more of the first factor or the second factor. The computing system in an operation 853 can generate a design. For instance, if a first factor is nesting a second factor, it would be a nesting design even if a third factor is indicated as crossed with the first factor and/or second factor (e.g., the third factor is crossed with a first factor then nested with a second factor or the third factor is nested with a first factor, then crossed with the second factor). The computing system can generate the nesting design in which selected options for the second factor from respective candidate options are constrained according to the assignment of groups, but selected options for the third factor from respective candidate options are distributed in design cases amongst factors in which the third factor is crossed (e.g., evenly in design cases amongst first factor and second factor options).

The computing system in an operation 854 can determine terms for a computer model for a computer simulation of the nesting design. An amount of terms (i.e., the number of those terms) in the computer model can be constrained by the computing system according to an initial nesting indication and/or subsequent indications. By increasing factors, the total terms proposed by the computing system for the computer model may increase but may still be constrained to be less than all candidate terms (e.g., for a design for all crossed factors). The computing system in an operation 855 can generate one or more computer-generated assessments of the nesting design based on the computer simulation of the nesting design according to the computer model.

FIG. 9A-9E illustrate an example graphical user interface 900 for generating a nested design using a graphical representation. In the example in FIG. 9A, users can add factors to a list of factors 920 (added factors not shown in FIG. 9A). For instance, the user can use add controls 922 to specify a number of additional factors to add, or the user can use remove control 924 to remove added factors. The user can also create a design structure in design structure area 910 by clicking the "plus" button 902 to add a factor (e.g., from list of factors 920). For example, graphical user interface 900 could for an interactive interface for specifying design structure in Measurement System Analysis (MSA) Design platform or a Custom Design platform.

FIGS. 9A-9E are applied to factors of a measurement system analysis only as an example where one or more factors in a design pertain to a design for a measurement system analysis. A measurement system analysis can include, for example, measurement tests by a measurement system, according to a design for evaluating a product set comprising one or more products. A measurement system can have a system of different measurement components (such as gauges, fixtures, software, and personnel) that enables the quantification, validation, or assessment of characteristics of a product. Analyzing a complex system like a measurement system can be resource and time intensive. For example, a test of a measurement system could include testing different operators (e.g., people with different skill levels and training for measuring a saw blade), testing different measurement tools (e.g., gauges, fixtures, test equipment, and/or calibration systems for measuring a chip pattern), testing different sampling plans or measurement plans (e.g., different approaches for selecting sampled saw blades), and testing different environments (e.g., testing properties of a chemical at different temperatures or humidity).

Example factors for the list of factors 920 could include a site factor for where a measurement in the measurement system is to occur. Additionally, or alternatively, the list of factors 920 could include an operator factor indicating multiple operator characteristics in an operator set, such as number of operators and different types of operators performing measurements. Additionally, or alternatively, the list of factors 920 could include an instrument or gauge factor indicating measurement tools of a tool set (e.g., number of measurement tools, different types, or calibrations of measurement tools). Additionally, or alternatively, the factors could include a part factor indicating a number or type of industrial product for analysis. For example, if the measurement system analysis is for measuring a rotating saw, factors in the measurement system analysis could include a part factor for a measured blade in the rotating saw, an operator factor for the operators measuring the saw blade, and a gauge factor for the calibration of the ruler for measuring the saw blade. Factors relevant to other purposes or used in other design analysis platforms could be used. These factors relevant to the measurement system analysis can be added to the factor list 920 in FIG. 9A. Additional controls for design cases can be provided in design area 926 (e.g., setting the number of replicated runs and treatment of runs such as completely randomized, batch repeat or fast repeat).

Figure 9A:
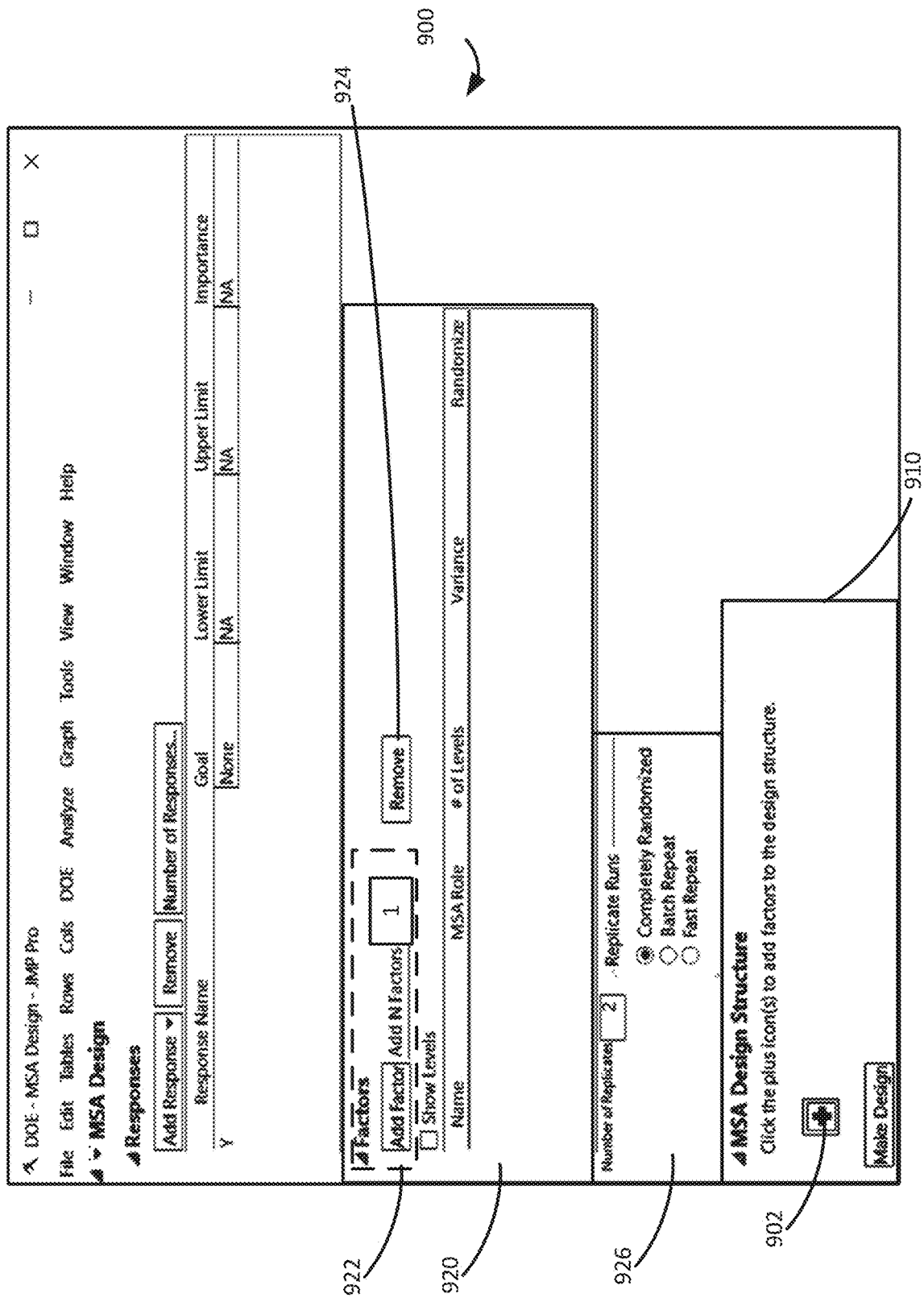
FIGS. 9A-9E illustrate example graphical user interfaces for generating a nested design using a graphical representation according to at least one embodiment of the present technology.
Figure 9B:
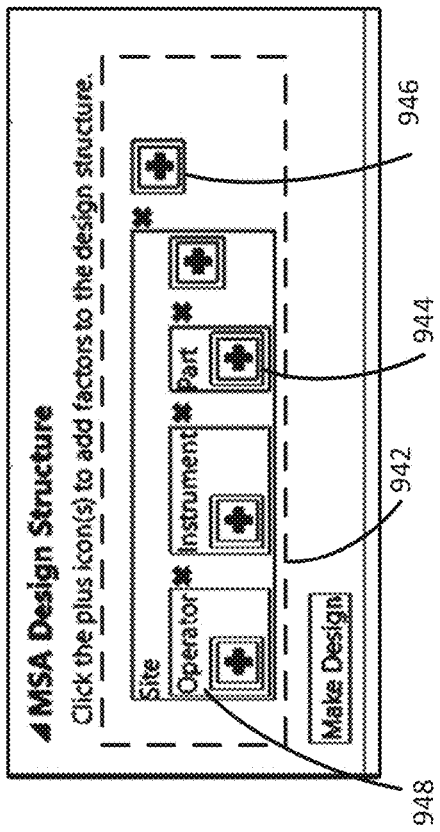
Figure 9C:
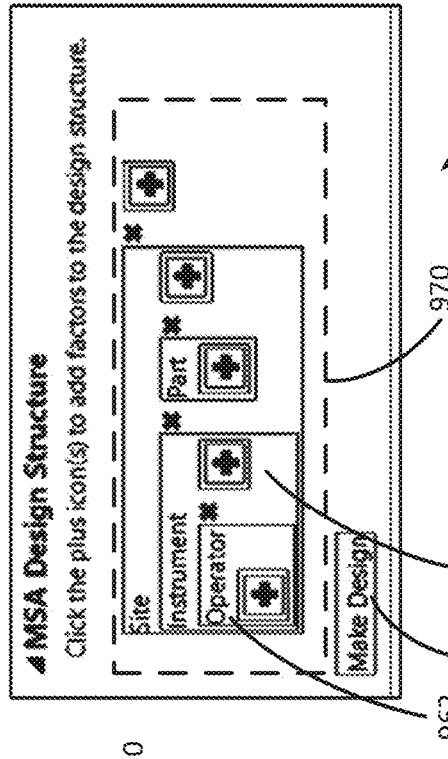

Once factors are added, in FIG. 9A, a user can select the button 902 in design structure area 910. In response, the graphical user interface 900 can generate a drop-down list 930 of factors (e.g., relevant to a measurement system analysis) as shown in FIG. 9B. As a factor is selected from the drop-down list 930, the graphical user interface 900 updates with new buttons indicating where users can place another factor. For instance, FIG. 9C shows a graphical representation of a nesting design 942 with 5 "plus" buttons indicating opportunities for additional nested factors (e.g., an internal "plus" button 944) or crossed factors (e.g., a "plus" button 946 separated from another factor by an "x").

Figure 9D:
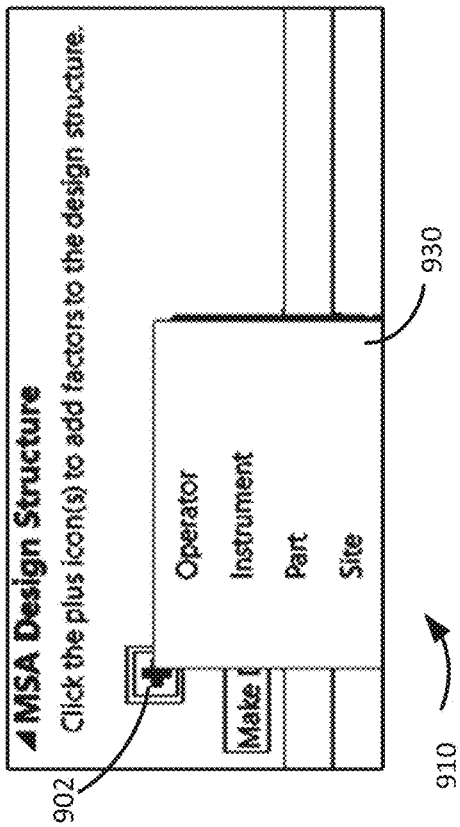
Figure 9E:
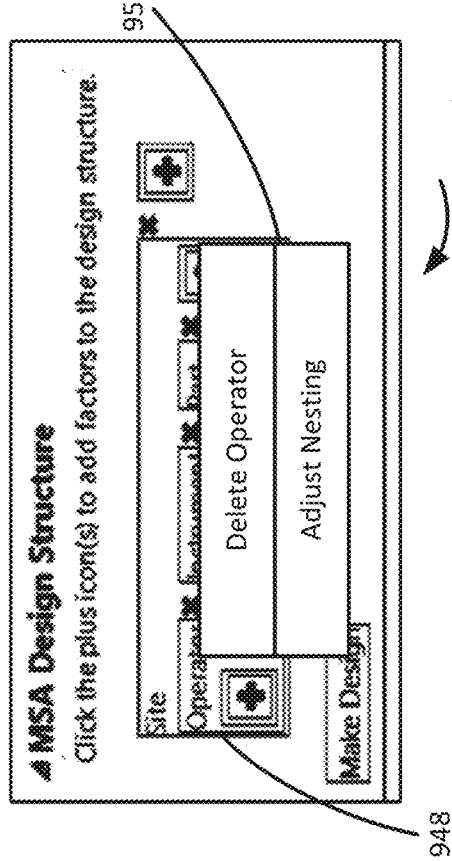

Suppose now that, in the experiment, the operators will be nested within instrument (i.e., each operator will not use every instrument), which is still nested within site along with part. In FIG. 9D, the user can adjust the nesting design 942 by selecting the Operator box 948, which brings up a pop-up menu 950 with the option to delete Operator box 948 of the nesting design 942. Selecting the "Delete Operator" option removes that box from the structure. If there were any factors nested within that box, they too could be removed. As shown in FIG. 9E, after deleting the Operator box 948, the user can add a new Operator box 962 within Instrument box 960 to reflect the new nesting design 970. As shown in FIG. 9E, a computing system can display, in the design structure area 910 of graphical user interface 900, respective icons representing one or more factors (e.g., Operator box 948 represents the operator factor) and receive, using the graphical user interface 900, a nesting indication by receiving user input arranging the icons in the design structure area 910.

Pop-up menu 950, or other menus, can have additional options for controlling the nesting design. For instance, an "Adjust Nesting" option may be used to adjust the ratio of options assigned to the different groups or to control the assignment of particular design cases. For instance, each time the user adds a factor to a design structure, updates can be made to keep track of each factor's relationship to other factors. Specifically, for each factor, there can be a list of other factors that directly nest it (can be empty) and another list of other factors which are nested within it (also can be empty). Additionally, or alternatively, these lists could be replaced with a global associative array list that can keep track of the entire structure. Accordingly, design cases could be interactively and dynamically assigned as the user is making structural decisions. Alternatively, relationship information could be collected when the user selects a control 980 to make a design. Keeping updated information regarding nesting relationships can be useful to ensure an appropriate model is used, for example, in diagnostics and response simulation.

Graphical user interfaces described herein can be interactive and connected. For instance, if a user changes the name of a factor in the factor list of the graphical user interface 900 in FIG. 9A, that change can be reflected in a design structure (e.g., nesting design 970 of FIG. 9E). If a user removes a factor from the list, that factor (and any nesting behavior it possesses) can also be removed from the design structure, and/or update the internal structure recording the design.

Figure 10A:
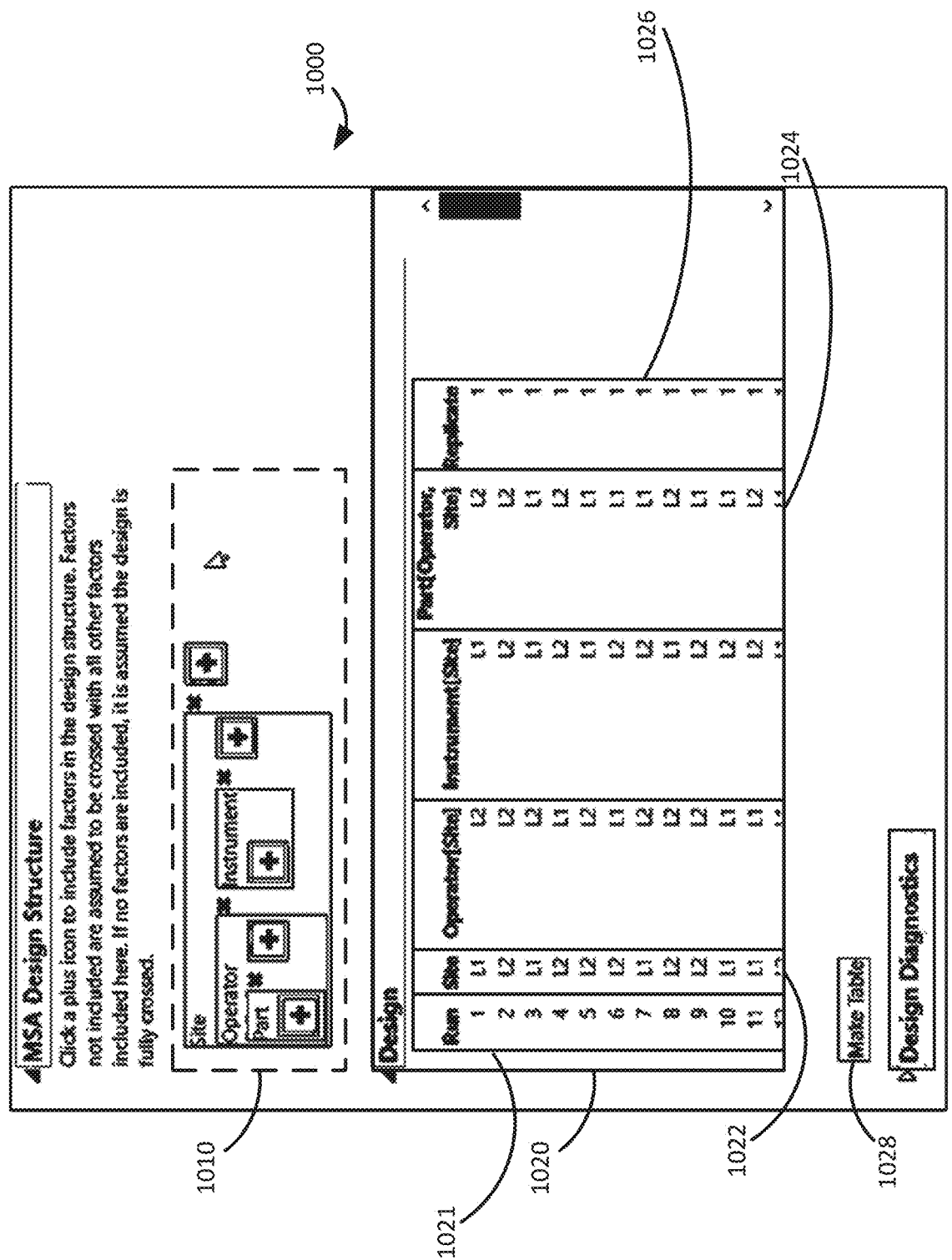

FIGS. 10A-10D illustrate example graphical user interfaces for generating a nested design and design diagnostics. FIG. 10A shows a graphical user interface 1000 with a design structure 1010 in which a part factor is nested within an operator factor and operator and instrument factors are nested within a site factor. A design 1020 is generated for the design structure 1010. The design can be used, for example, for diagnostics and response simulations. For instance, a run column 1021 represents the order of design cases for a simulation or execution of an experiment.

A nesting design such as the one represented by the design structure 1010 can be useful to determine what table scripts are appropriate for follow-up analysis when a data table is created for the design (e.g., selecting option 1028 to make a table in accordance with the design 1020, so that the design-analysis process is seamless).

The design structure 1010 can also be used to determine the order in which factors appear in the design or table, so that factors near the "top" of the structure appear further to the left in the design or design table than factors closer to the "bottom" of the structure. For instance, in the design 1020, site column 1022 is shown in the left most column of factors. In contrast Part [Operator, Site] column 1024 is shown in the right most column of factors. A replicates column 1026 can show how often particular design cases are repeated within a design.

An interactive graphical user interface is shown merely as an example. Additionally, or alternatively, to interactively specifying a design structure in a graphical user interface or performing other diagnostics, users can also specify it via scripting. For example, a user could use the command: Nesting Structure ({"Site", {{"Instrument", "Operator"}} || "Part"), where brackets are used to indicate nesting according to the following scheme: {nesting factor, {nested factor(s)}} and the "||" symbol represents crossing. This script can also include whenever a user saves the script to create the design. Graphical user interfaces are used in examples for explanation, but other techniques (such as scripting) could instead be used.

FIG. 10B shows computer-generated assessments in a graphical user interface 1030 with the computing system taking into account the nesting indications related to the nesting design in FIG. 10A. FIG. 10C shows computer-generated assessments in a graphical user interface 1040 if the computing system did not take into account the nesting indications related to the nesting design in FIG. 10A. In other words, every factor is considered crossed with another factor. The metrics in the estimated bias column 1036 and estimated standard deviation column 1034 for the Gauge R&R metrics section 1032 in graphical user interface 1030 achieves closer to zero values (an optimal value) than the estimated bias column 1046 and estimated standard deviation column 1044 for the Gauge R&R metrics section 1042 in graphical user interface 1040. Further, graphical user interface 1030 provides a more accurate estimate of metrics for the Evaluating the Measurement Process (EMP) classification section 1038 than the Evaluating the Measurement Process (EMP) classification section 1048 in the graphical user interface 1040. EMP classification and Gauge R&R studies are used to assess consistency, reproducibility, or repeatability of a measurement system. Having more accurate or better pre-assessments can be useful for producing a design that can ultimately pass these classifications or studies. Further, accounting for the nesting relationship in the design diagnostics can reduce variation in some of the main effect terms (Operator, Instrument, and Part) as shown in more detail in FIG. 10D. This distinction is helpful, since showing diagnostics under a fully crossed design could lead to unnecessary changes to the design to try and overcome extra variation (or improve design metrics).

Figure 10D:
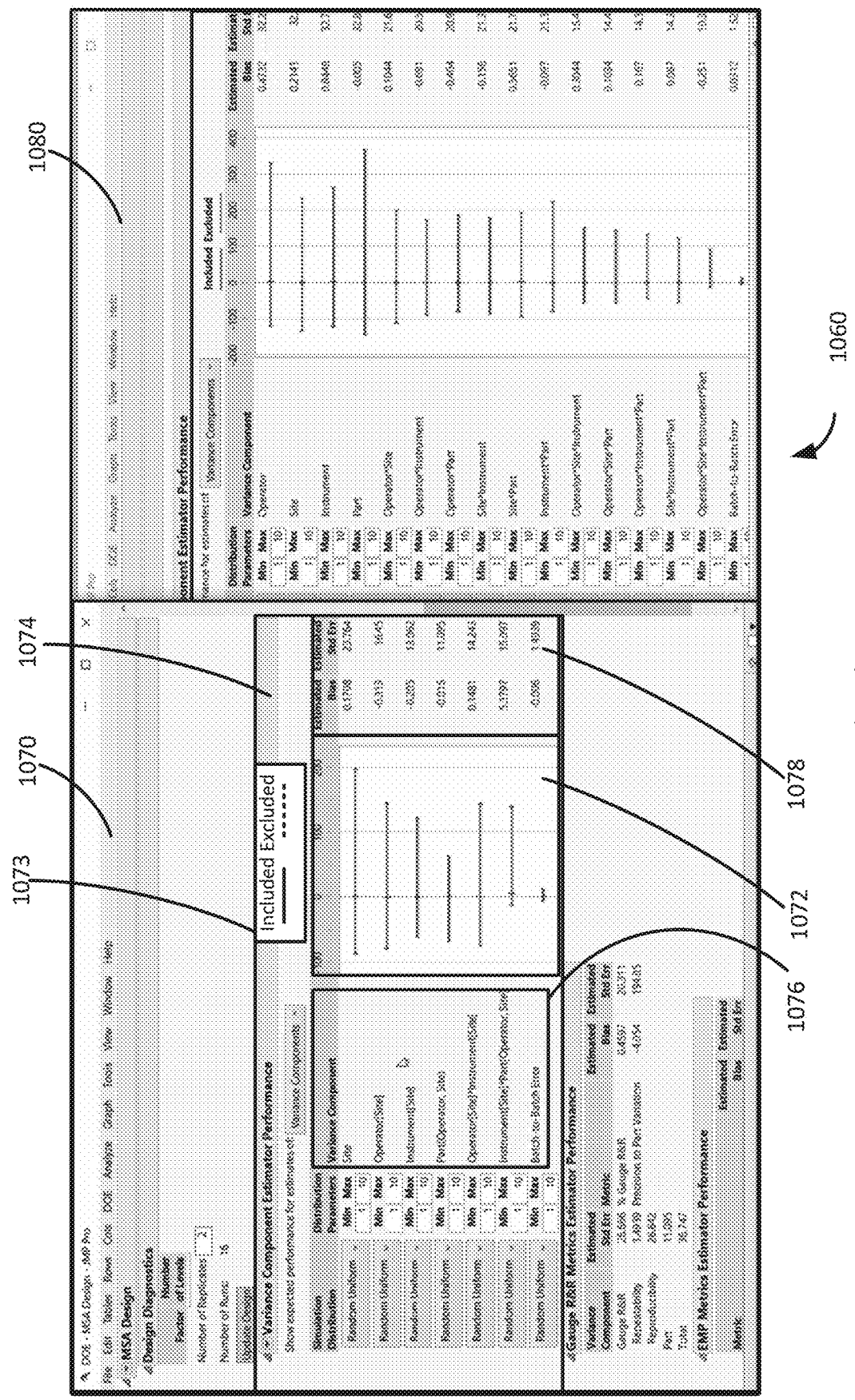

FIG. 10D shows a graphical user interface 1060 with design diagnostic 1070 showing a computing system taking into accounting the nesting indication. For instance, the design diagnostic 1070 shows the computing system is configured to generate terms for the computer model by displaying, in the of graphical user interface 1060, computer-generated model terms (e.g., variance components 1076) indicating terms of a nested type. For instance, Operator is a factor with a factor status from the nesting design indicating the Operator factor is nested within another factor of the nesting design, so the computer system determines a term of model type "Operator [Site]" in view of this factor status in design diagnostic 1070. Additionally, Operator is a factor with a factor status from the nesting design indicating it is a factor nesting another factor of the nesting design, so the computing system determines a term of model type "Part [Operator, Site]" based on this relationship in design diagnostic 1070. In this example because there are also crossed factors crossed with Operator in the nesting design, there are also model terms further indicating terms of an interaction type for crossed factors of the nesting design (e.g., "Operator [Site] *Instrument [Site]") in response to a factor status indicating crossed factors.

Design diagnostic 1080 shows the computing system not taking into accounting the nesting indication. As shown in portion 1074 there are significantly fewer model terms in design diagnostic 1070 than in design diagnostic 1080 because the model terms can be constrained based on the nesting information. The graphical user interface 1060 shows a difference in which terms are estimated by the computing system. Interactions involving the Site factor are absent in the design diagnostics 1070 accounting for nesting relationships in the nested design. These interactions are present in design diagnostic 1080 and could be misleading for test planners in a nesting design. In the design diagnostic 1080, there are also not terms of the nesting type even though the design was a nesting design.

In one or more embodiments, a computing system can receive user input indicating to further exclude or include one or more model terms of the computer-generated model terms. For instance, chart 1072 shows solid lines for each of the variance components 1076 to indicate according to the key 1073 their inclusion in a computer model for the design. One or more computer generated assessments for the design can be specific to particular assessed factor, or assessed interaction of crossed factors, in the nesting design rather than a wholistic assessment as shown in FIGS. 10B and 10C. For instance, estimates 1078 show the estimated bias and standard error for each of the included terms specific to assessed factors (e.g., Site) or assessed interaction of crossed factors (e.g., Operator [Site] *Instrument [Site]). The graphical user interface 1060 can show an indication of nesting relationships for the assessed factors or assessed interaction of factors (e.g., using different symbols such as brackets for nesting relationships and asterisks for crossed relationships). The user can select the lines in chart 1072 to toggle between included and excluded terms specific to these different factor types. In this example, included terms according to the key 1073 will be dotted lines. In other examples different colors could be used (e.g., green for included terms and red for excluded terms). The estimates 1078 would then become zero to also reflect excluded terms.

Graphical user interface 1060 is interactive so that the user can adjust the design structure and have the design diagnostics update. Accordingly, the two design diagnostics shown in graphical user interface 1060 (i.e., design diagnostic 1070 and design diagnostic 1080) could be produced by a user initially representing the factors of the nesting design as crossed, so that the computing system would generate terms for the computer model by receiving, using the graphical user interface, a cross indication that factors were crossed with one another and generate a graphical user interface displaying candidate computer-generated model terms as show in design diagnostics 1080. Then the user could change the structure so that the computing system could receive the nesting indication after the cross indication and update the graphical user interface to display less total computer-generated terms than the candidate computer-generated model terms according to the cross indication (e.g., as shown in design diagnostic 1070). Additionally, or alternatively, the user could first represent a nesting design and change to include more crossed elements to increase the candidate terms available for a computer model.

In some embodiments, by being able to represent the nesting structure of the experiment, design assessments can be improved (e.g., assessments as part of measurement system analysis). Measurement system analysis platforms can be useful for evaluating industrial products, such as mechanical or electrical system components or substrates that can be prone to variations when manufacturing large quantities. Variations can be problematic if, for instance, the industrial products should be within certain tolerances such as for safety (e.g., automotive or airplane components) or simply to fit together well (e.g., toy snap together bricks). Variations may come from many sources such as the part itself or the measurement process for measuring the variation. Assessment of the design for conducting a measurement system can indicate variability caused by a factor of the measurement system analysis as shown here. Additionally, or alternatively, industrial parts or their measurement process can be classified based on their likelihood of meeting certain measurement standards given possible variations. Classifications or evaluations for industrial products can consider variations that come not only from a product itself, but from the measurement process such as the measurement tools, measurement operators, and measurement techniques. For instance, measurement tests can be designed and executed on a set of industrial parts for an Evaluating the Measurement Process (EMP) classification, which can be used to assess consistency, reproducibility, or repeatability of a measurement system. Accordingly, one or more computer-generated assessments can include a likelihood of classification into one of multiple groups for the product set according to a measurement standard (e.g., an EMP classification) or a likelihood of going beyond a threshold related to the measurement standard.

Embodiments described herein could be used in other platforms or for other assessments. For example, the platform could have more or fewer diagnostic measurements such as additional diagnostics for fixed effects, which can also be nested. Additionally, or alternatively, a measurement system analysis (MSA) platform could operate differently than the one in this example. For instance, in this MSA platform, multiple variances for the factors are computer-generated and distributed for each of the factors in simulations for determining the computer-generated assessments shown here. In other measurement system analysis, variance can be supplied by the user for simulating the factors according to a user supplied variance such as the platform shown and described in U.S. Pat. No. 11,346,751, issued May 31, 2022, and incorporated by reference.

Figure 10E:
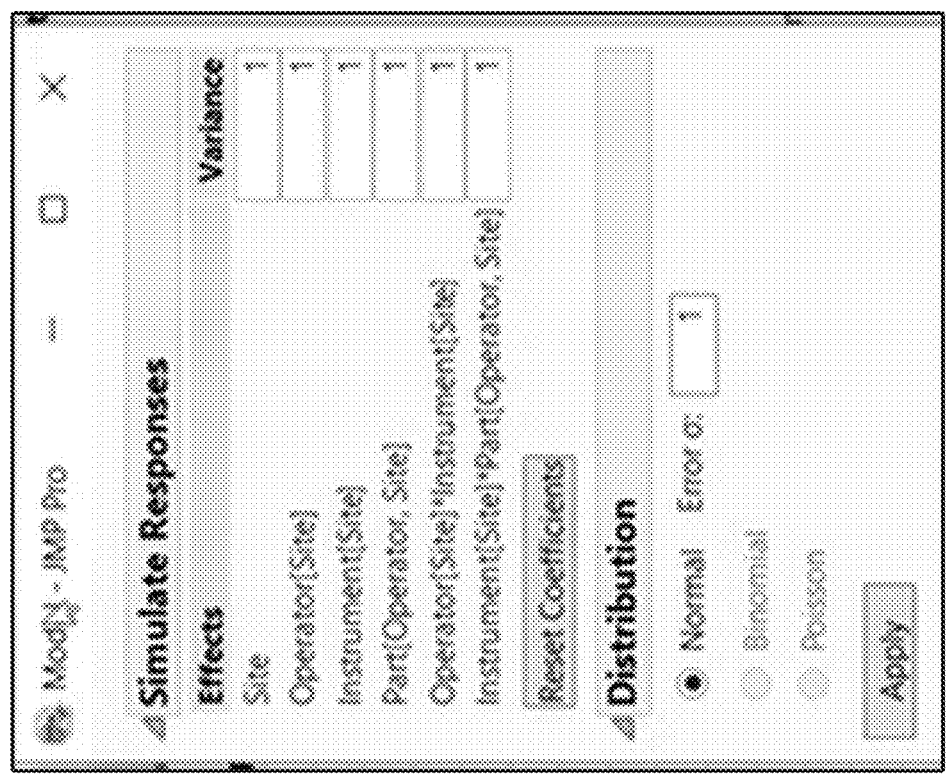

FIG. 10E shows an example simulation control window 1090 after a design has selected options for one or more factors as input into the computer simulation for the design in design diagnostic 1070. The user has further reduced model terms for the simulation (e.g., "Batch-to-Batch error, which had a small effect on variance computations, has been removed"). The computing system can receive one or more responses according to the computer simulation based on the input and generate one or more computer-generated assessments based on the one or more responses according to the computer simulation. The user can also update the simulation by updating other aspects of the design diagnostics or simulations besides simulation components shown in this simulation control window 1090.

Figure 11A:
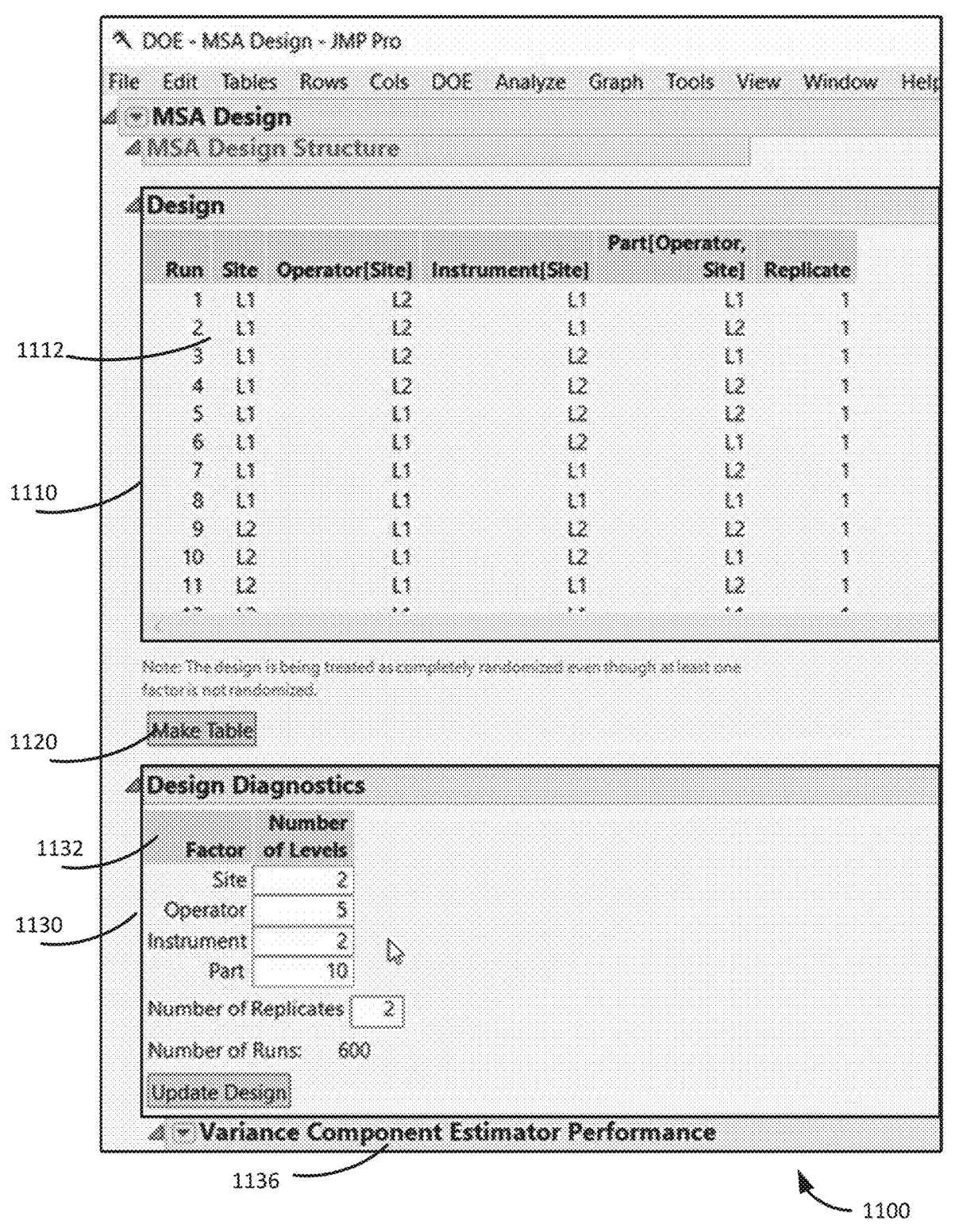

For instance, FIG. 11A illustrates an example graphical user interface 1100 for updating design diagnostics for the design structure 1010 in FIG. 10A. Graphical user interface 1100 displays a design 1110 of design cases for an experiment or simulations. For instance, a computing system can be used to create multiple candidate designs and generate the displayed design (e.g., a nesting design) by selecting from the multiple candidate designs. For instance, the computing system can pick the candidate design that best achieves an objective for one or more computer-generated assessments of the design (e.g., to maximize or minimize an assessment). For instance, a computing system could minimize the expected standard error of a particular metric the user specifies. As shown in FIG. 11A, the graphical representation of the design 1110 shows design cases and indicates nesting relationships for factors in the nesting design (e.g., Operator [Site] indicates the Operator factor is nested within the Site factor).

In the design diagnostics portion 1130 of the graphical user interface 1100, a user can change aspects of the design 1110 to affect one or more computer-generated assessments for the design 1110. For instance, a computing system can receive one or more change indications from the user adjusting an amount or range of candidate options for a given factor of a design (e.g., a number of levels for factors). Additionally, or alternatively, the computing system can receive one or more change indications from the user adjusting an amount (i.e., number) of replicates of design cases in a design. Additionally, or alternatively, the computing system can receive one or more change indications from the user adjusting a number of "runs" or design cases in a design. Additionally, or alternatively, the user can select factor column 1132 to increase or decrease factors in the design (e.g., from an earlier provided factor list). The computing system can update the graphical user interface to display at least one updated computer-generated assessment accounting for the change indication (e.g., in the below variance component estimator performance section 1136 of the graphical user interface 1100). Accordingly, a user can engage in "what if" analysis by looking at different changes that could be made to the design to see how it would affect computer-generated assessments. For instance, the user can use a computing system to explore questions like what if the number of levels for a factor is 2 or what if it is 5? The computing system can show how these differences would affect the evaluation of the resulting design. In some embodiments, a computing system can make these adjustments without updating the particular design cases displayed in design 1110 (e.g., using the design diagnostic portion 1130).

FIG. 11B-11E show an example of using options to update the assessment using design diagnostic portion 1130. For instance, FIG. 11B shows the design diagnostic portion 1130 shown in FIG. 11A at a first time period with assessments of the design from variance component estimator performance section 1136 of FIG. 11A shown in table 1150 of FIG. 11D. The user can adjust these settings and select update design control 1134 to see how this would affect assessments. For example, design diagnostic portion 1140 shown in FIG. 11C is shown at a second time period with the number of levels reduced for part and operator factors. The assessments for this changed design are shown in table 1170 of FIG. 11E. This change dramatically reduced the number of design cases from 600 to 16 runs as shown in FIGS. 11B and 11C, which could save processing time or costs for an experiment. However, the estimated bias and standard deviation got closer to 0 for percent Gauge R&R and Precision to Part Variation improving the design assessment. A user can use these controls to strike a balance between design assessment and design objectives (e.g., the number of design cases or runs).

Figure 12A:
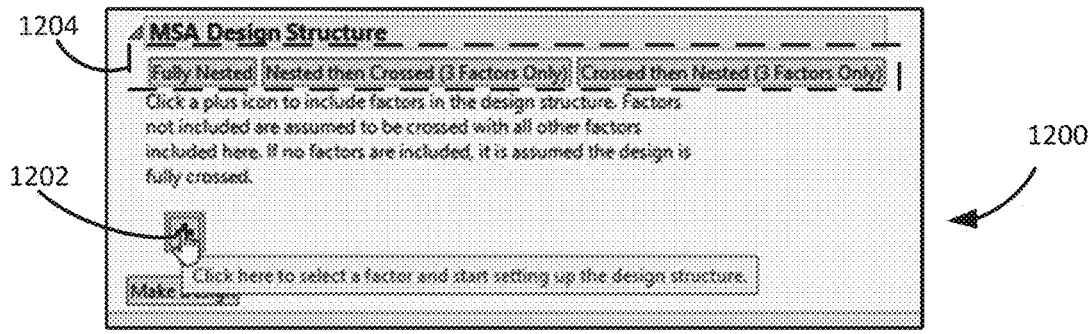
FIGS. 12A-12D illustrate example graphical user interfaces for generating a nested design using guided user prompts according to at least one embodiment of the present technology.

FIG. 12A-12D illustrate example graphical user interfaces for generating a nested design using guided user prompts. FIG. 12A illustrates an example portion 1200 of a graphical user interface for user input of a design structure. As described with respect to other examples, users can add factors to create a nested or crossed design using the plus control 1202. This example, has additional options 1204 for computer-assisted structure creation (e.g., using a guided prompt).

Figure 12B:
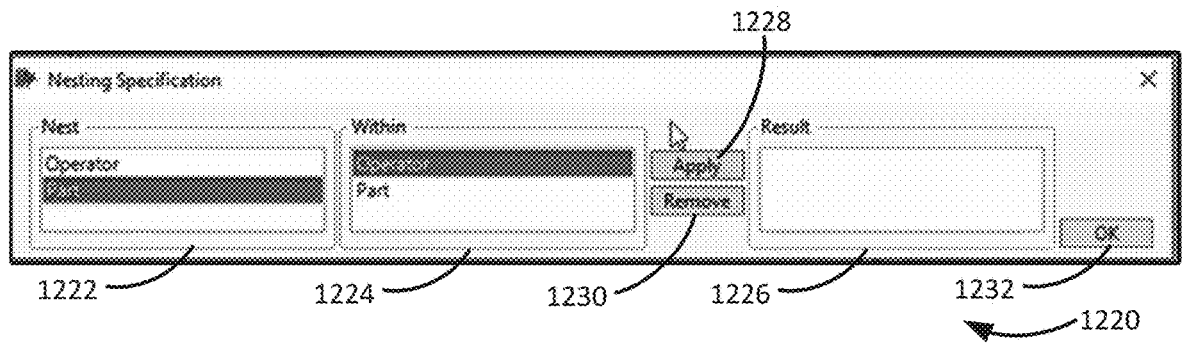

FIG. 12B shows an example guided prompt 1220 for user input indicating a factor is nested within another factor if the user selects the option of "Fully Nested" from the options 1204. In this example, available factors can be displayed in a "Nest" column 1222 and "Within" column 1224. The user can select a factor from each list and use the apply control 1228 to have the nesting relationship added to a results column 1226. For example, the user's selection of "Part" and "Operator" would result in the nesting relationship of part nested within operator. The user can keep using the apply control 1228 to add as many nesting relationships as wanted for an experiment. The user can also use the remove control 1230 to remove nesting relationships. When the user has created a series of nested factors, the user can select the "Ok" button 1232, and the computing system can receive a nesting indication indicating to fully nest a series of multiple factors in a design according to the result column 1226.

Figure 12C:
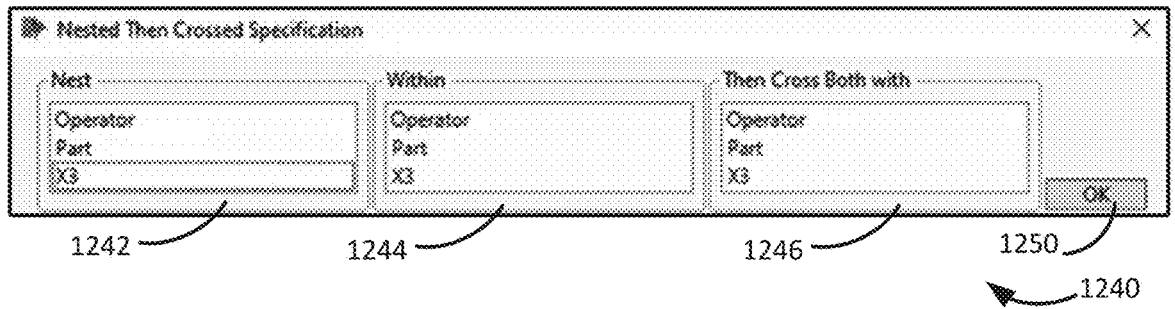

FIG. 12C indicates a guided user prompt 1240 if the user selects option "Nested then Crossed" from the options 1204 in FIG. 12A. In this example, available factors can be displayed in a "Nest" column 1242, "Within" column 1244, and a "Then Cross Both with" column 1246. The user can select a factor from each list resulting in a nesting design. Because in this example the structure is limited to three factors, after making selections from each column, the user simply uses the "Ok" control 1250 to create the design. Accordingly, if a first factor was selected to nest within a second factor, the computing system could receive in response a nesting indication indicating to cross a third selected factor with both the second factor and the first factor.

Figure 12D:
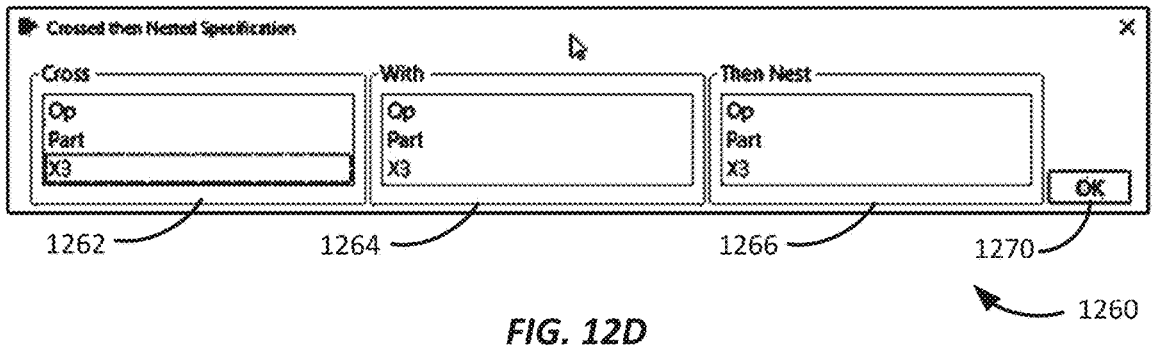

FIG. 12D indicates a guided user prompt 1260 if the user selects option "Crossed then Nested" from the options 1204 in FIG. 12A. In this example, available factors can be displayed in a "Cross" column 1262, "With" column 1264, and a "Then Nest" column 1266. The user can select a factor from each list resulting in a nesting design. Because in this example the structure is also limited to three factors, after making selections from each column, the user simply uses the "Ok" control 1270 to create the design. Accordingly, if two factors were crossed, the crossed pair could then be nested within a third factor, the computing system could receive in response a nesting indication indicating to cross two factors, then nest within a second factor.

Guided prompts such as in FIGS. 12C and 12D shown limiting the number of factors could alternatively be unlimited (e.g., using the apply control 1228 and remove control 1230 as in FIG. 12B). Guided prompts shown as unlimited such as in FIG. 12B could alternatively be limited. In one or more embodiments, guided prompts can be used by the computing system to generate computing instructions for one or more computer-generated assessments of a design or for automatically updating other graphical user interfaces. FIGS. 13A-13C and 14A-14B provide examples.

Figure 13B:
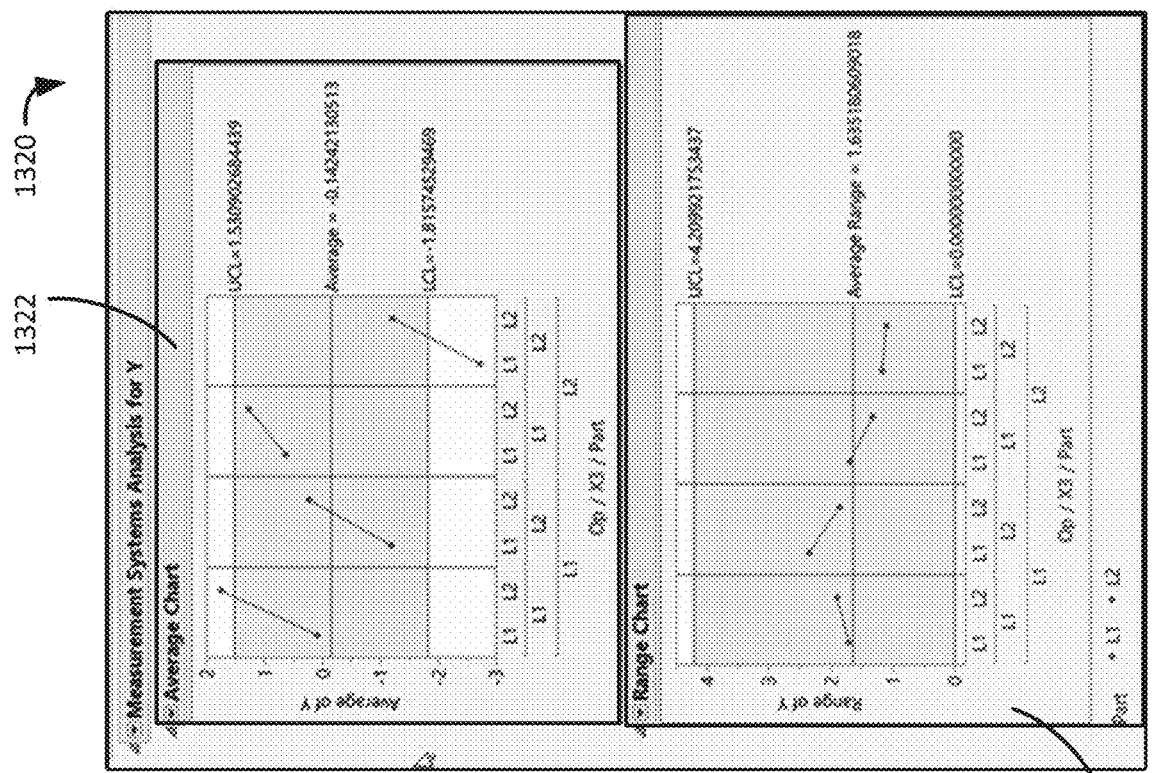
FIGS. 13A-13C illustrate example computer instructions for generating a measurement system analysis according to at least one embodiment of the present technology.
Figure 13A:
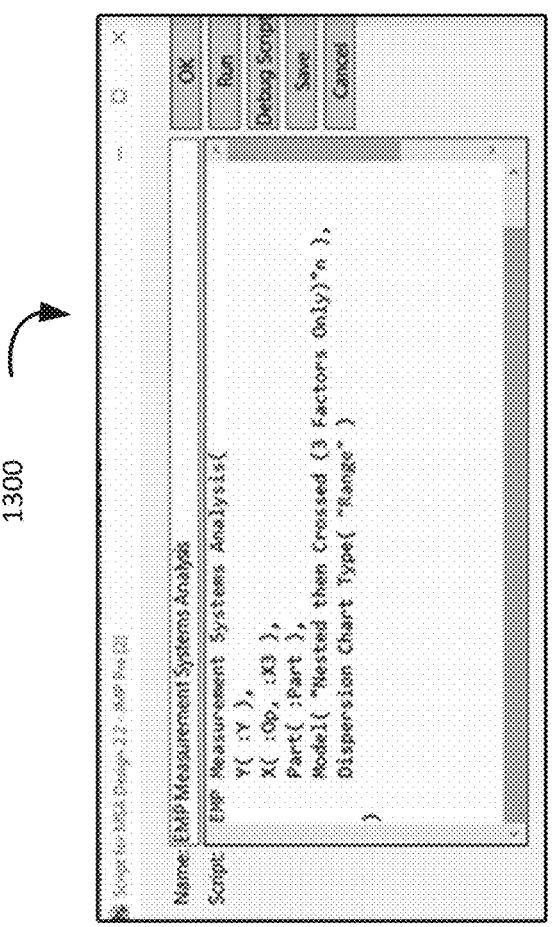
Figure 13C:
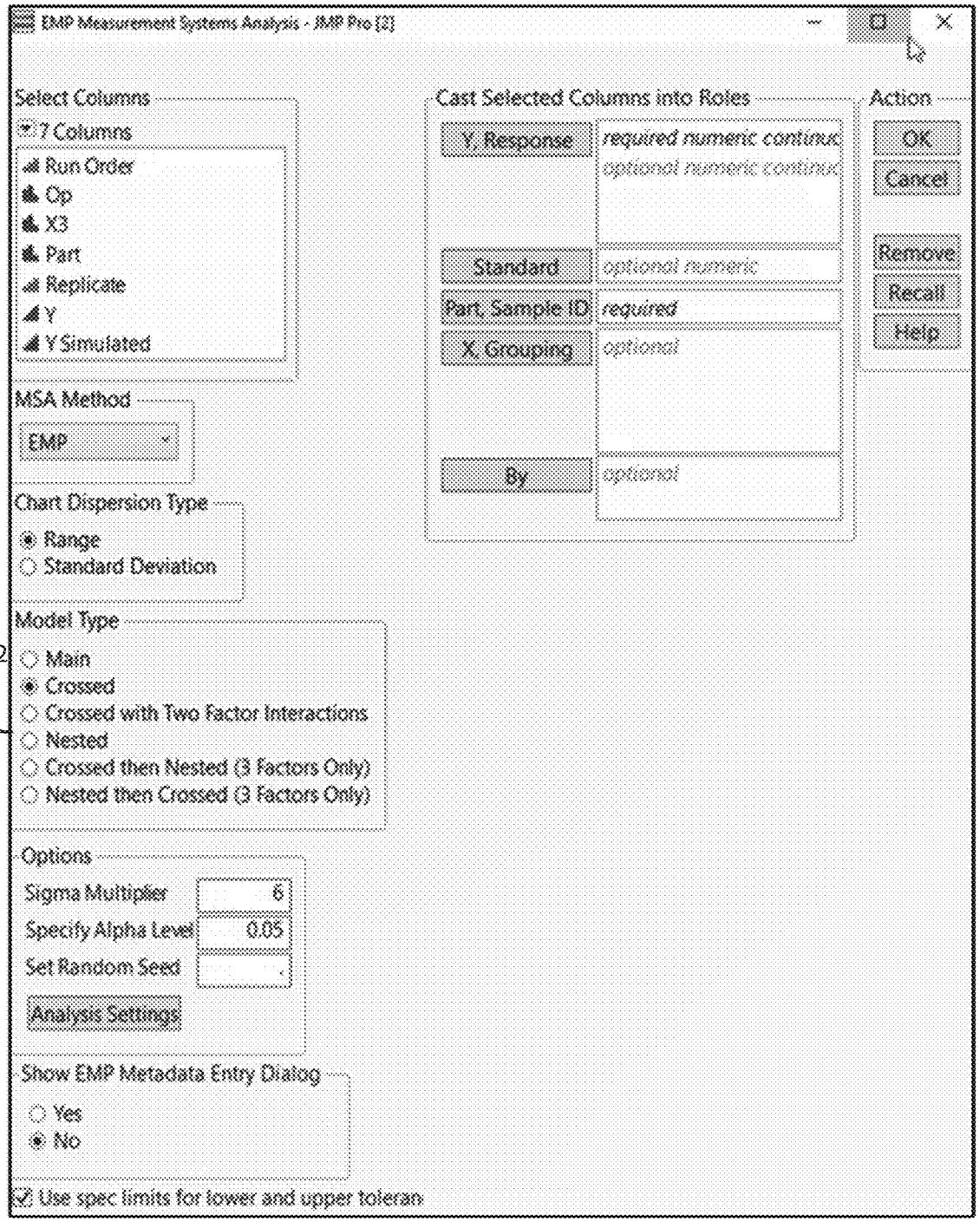

FIGS. 13A-13C illustrates example computer instructions for generating a measurement system analysis. FIG. 13A illustrates example computing instructions generated in a script 1300 to generate a chart of assessments of a design for a measurement system analysis. FIG. 13B shows a graphical user interface 1320 with example Average Chart 1322 and Range Chart 1324 generated in response to the script 1300. Both of these charts can be used to demonstrate systematic trends. In the Average Chart 1322, it shows trends in the average responses (if any). In the Range Chart 1324, it shows trends in the range/standard deviation of the responses (if any). In this example, both methods show a strong part-to-part variation along with some pretty strong operator-by-X3 trends (note how the lines across levels of X3 are not too far from each other for Op 'L1' but pretty far apart for Op 'L2'). The Range Chart 1324 also indicate that Op 'L1' might have more variation in their responses than Op 'L2'. These charts help guide the analyst on where to make potential changes to reduce variation in their measurements. FIG. 13C shows an example of a graphical user interface 1340 automatically and dynamically updated to account for the model type 1342 (e.g., in response to user input to guided prompts or user input for a design structure). For instance, the model type 1342 is showing as "crossed".

Figure 14B:
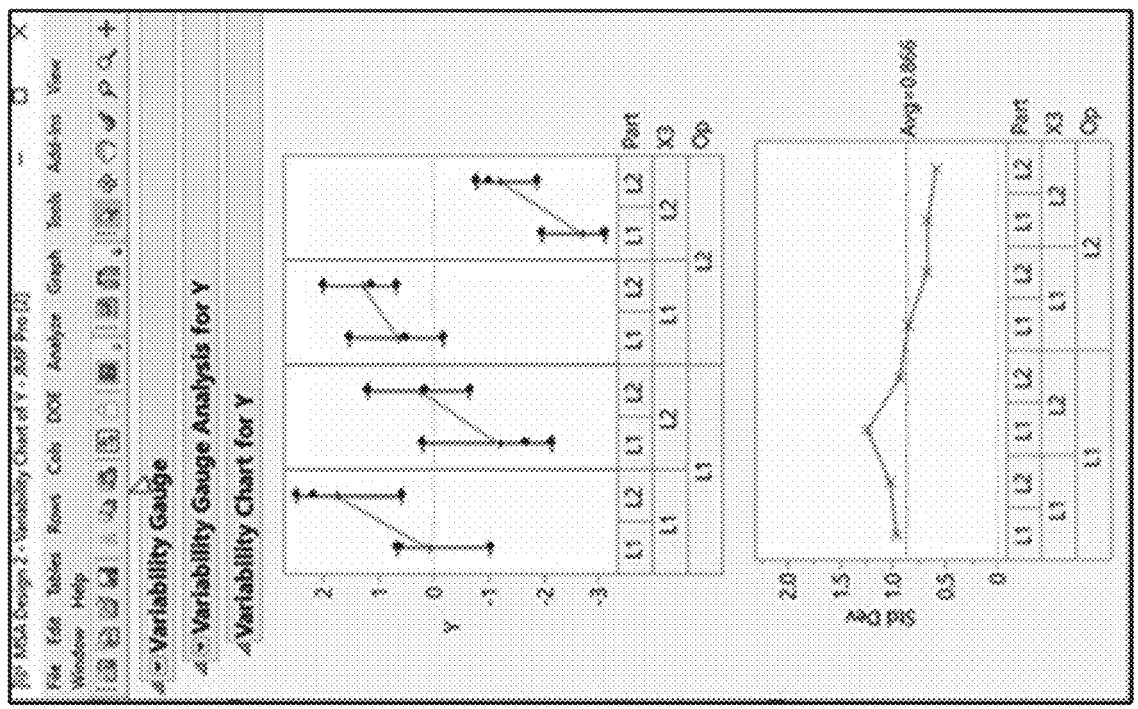
FIGS. 14A-14B illustrate example computer instructions for generating a variability analysis according to at least one embodiment of the present technology.
Figure 14A:
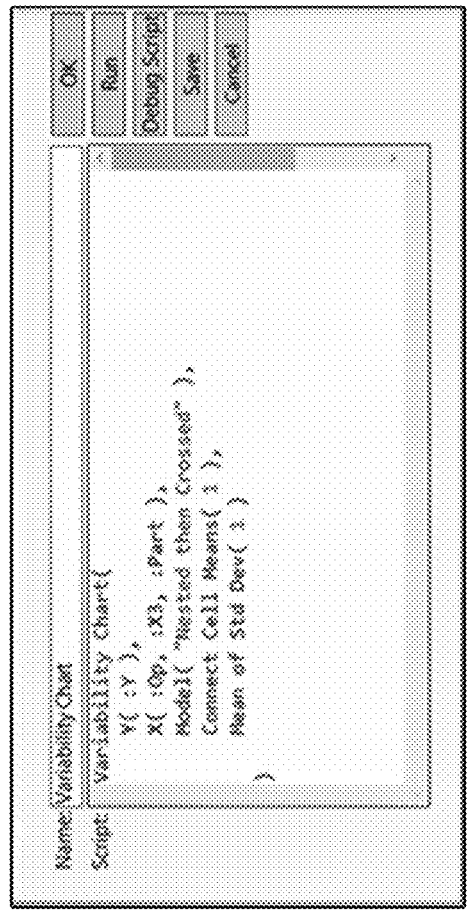

FIGS. 14A-14B illustrates example computer instructions for generating a variability analysis. FIG. 14A illustrates example computing instructions generated in a script 1400 to generate a chart of assessments of variability for a design for a measurement system analysis. FIG. 14B shows an example chart 1450 generated in response to the script 1400. By having updates to scripts, charts, and graphical user interface settings as shown for instance in FIGS. 13A-13C and 14A-14B, the user can more seamlessly affect other aspects of a computing system.

Figure 15:
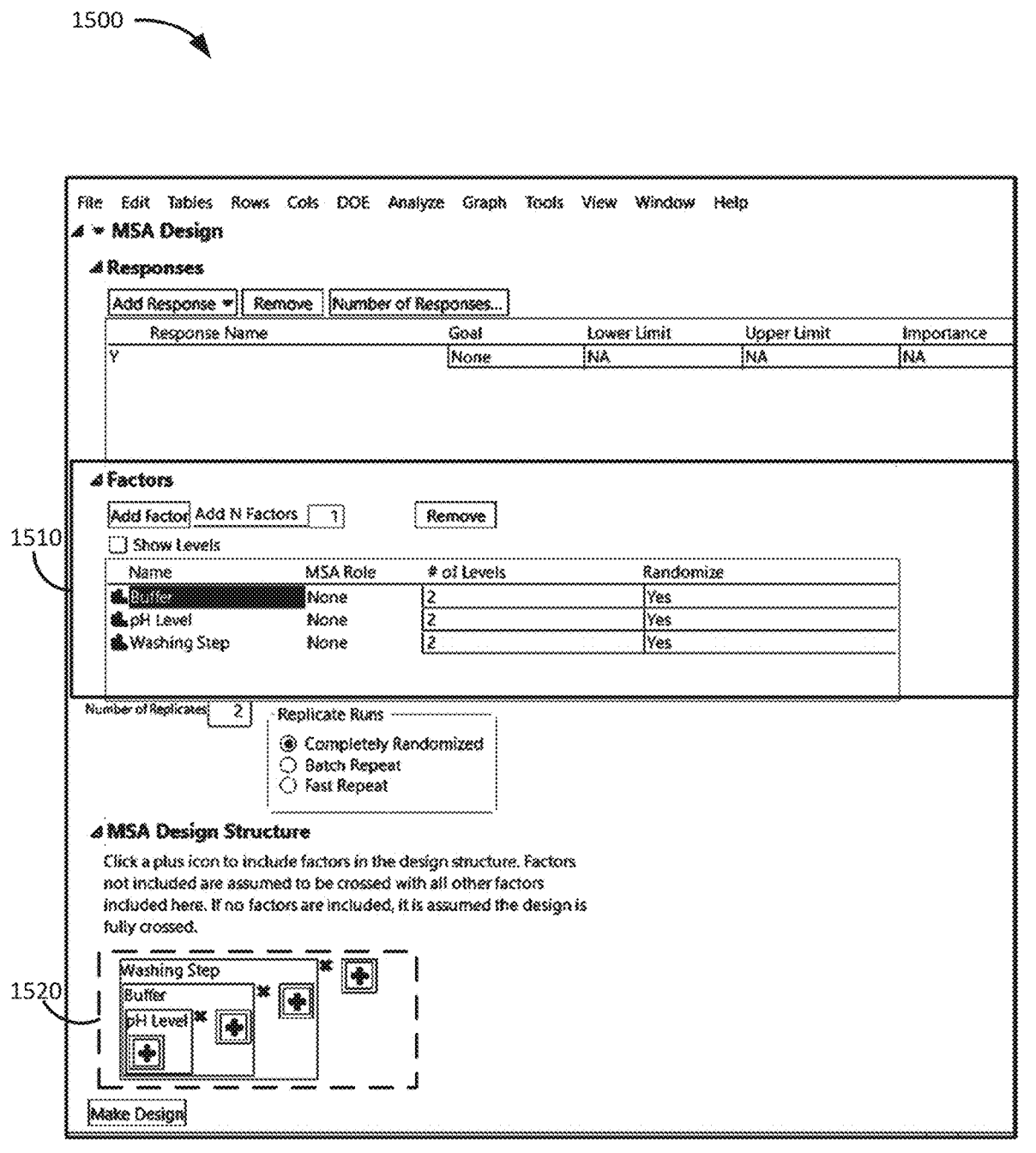

One or more embodiments described with respect to categorical factors are also applicable to continuous factors. FIG. 15 illustrates an example of a nesting design for continuous factors. In this example experiment for FIG. 15, a pharmaceutical company is doing an experiment to optimize yield and purity in an extraction process involving two washing steps. The washing step could use different buffer types. The level of ph is a continuous factor that ranges depending on a buffer type used in the washing step. For instance, one washing step could have a ph Level range from 6 to 8 for one buffer type in the first wasting step, while it is restricted to a range of 7 to 8 for a second buffer type in a second washing step.

FIG. 15 shows factors 1510 of buffer, ph Level, and washing step to represent the different features of the experiment. Design structure 1520 shows the nesting design with the factor ph Level nested within buffer, and buffer nested within washing step to represent this experiment.

In embodiments, such as the example in FIG. 15, one or more factors in an experiment are categorical factors with candidate options comprising categorical options (e.g., buffer type and wash step factors) and one or more factors in the experiment are continuous factors where candidate options comprise a range set of one or more ranges for options for the second factor (e.g., ph Level can have options in the range from 6 to 8 or 7 to 8 with levels representing the endpoints). The computing system according to the nesting design, can portion the categorical candidate options by distributing the category options to different groups. For instance, one buffer type can be distributed to one washing step and another buffer type can be distributed to another buffer step. The computing system according to the nesting design, can portion the range candidate options by distributing one or more ranges of the range set to different groups (e.g., distributing ph range 6 to 8 to one buffer type and wash step and distributing ph range 7 to 8 to another buffer type and wash step).

Figure 16:
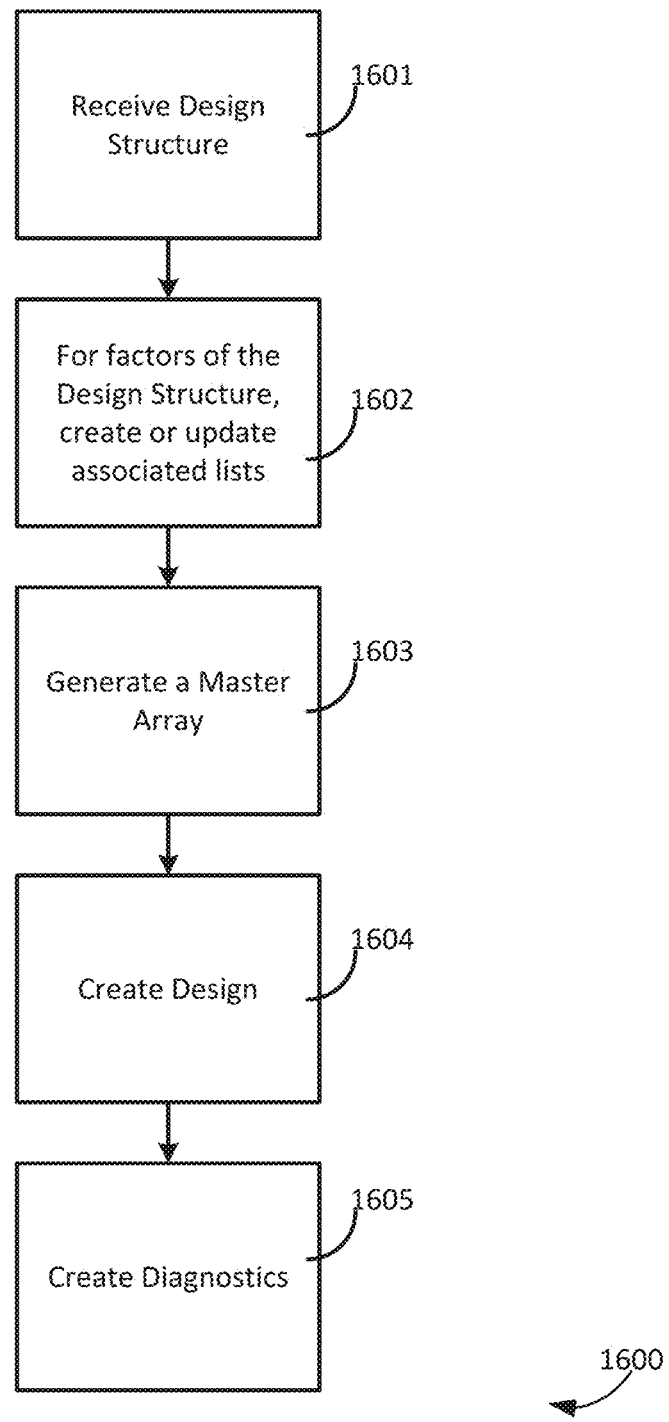
FIG. 16 illustrates an example flow diagram for a method 1600 of generating a computing structure for a nested design according to at least one embodiment of the present technology.

FIG. 16 illustrates an example flow diagram for computer processing for generating a computing structure for a nested design. An operation 1601 of method 1600 includes receiving a design structure. For instance, the user inputs a nesting design with nesting indications and indicates to make a design. The computing system can generate, in response to the nesting indication, one or more computing structures indicating nesting and cross relationships between factors in the nesting design. A computing structure can include one or more of a computing vector, a computing list, a computing array, or a combination thereof. For instance, an operation 1602 of method 1600 includes creating or updating associated lists for factors of the design structure. For instance, within each factor, the computing system can create or update a list which stores the names of factors directly nested within the current factor. Additionally, or alternatively, the computing system can create or update a list which stores the names of factors directly nesting the current factor. For example, FIG. 17A illustrates an example design structure 1702 input into a graphical user interface 1700. FIGS. 17B-17D show example lists for each of the factors. For instance, FIG. 17B shows an operator list 1720 showing that instrument and part are in the "nesting list" for operator and site is in a "nested within list" according to the design structure in FIG. 17A. FIG. 17C shows an example factor list 1740 for Site factor. FIG. 17D shows an example factor list 1760 for Instrument factor. FIG. 17E shows an example factor list 1780 for Part factor. These separate lists shown in FIGS. 17B-17E can be used to make a master array representing all the lists.

For example, an operation 1603 of method 1600 in FIG. 16 includes generating a master array (e.g., in response to the user selecting to generate a design using make design button 1704 in FIG. 17A). For instance, master array 1790 has a names vector 1792 indicating the list structure of the internal array 1794 which is a list of lists where, for each factor, there is a list of characters (in this case a row) indicating the relationship of that factor to another factor. In this example, an 'm' represents the relationship of the factor to itself (stands for main). An 'x' indicates that the factor is crossed with the other factor in that position of the list. In this example, there were no crossed factors, so no x indicated. An 'n' indicates that the factor is nesting the other factor in that position of the list (either directly or as part of a nesting chain). A 'w' indicates that the factor is nested within the other factor in that position of the list (either directly or as part of a nesting chain).

The computing system can use the master array 1790 to re-sort factors in hierarchical order (including a re-sort of the master array itself and its entries). For instance, the organization of the names vector 1792 can be changed with corresponding changes in the internal array 1794. A master array (e.g., the master array 1790) can be used to create a model, which can serve as the basis for design, evaluation, and simulation. For instance, an operation 1604 of method 1600 includes creating a design. The computing system can use one or more computing structures created (e.g., in operations 1601-1603) to portion candidate options for the factors in a design. An operation 1605 of method 1600 includes creating diagnostics. For instance, the computing design can receive a nesting indication by receiving a level in a nesting hierarchy for each factor of the nesting design (e.g., based on hierarchical order in a master array), and generate the one or more computer-generated assessments based on the nesting hierarchy (e.g., based on simulations for a resulting design according to the hierarchical order).

Figure 18A:
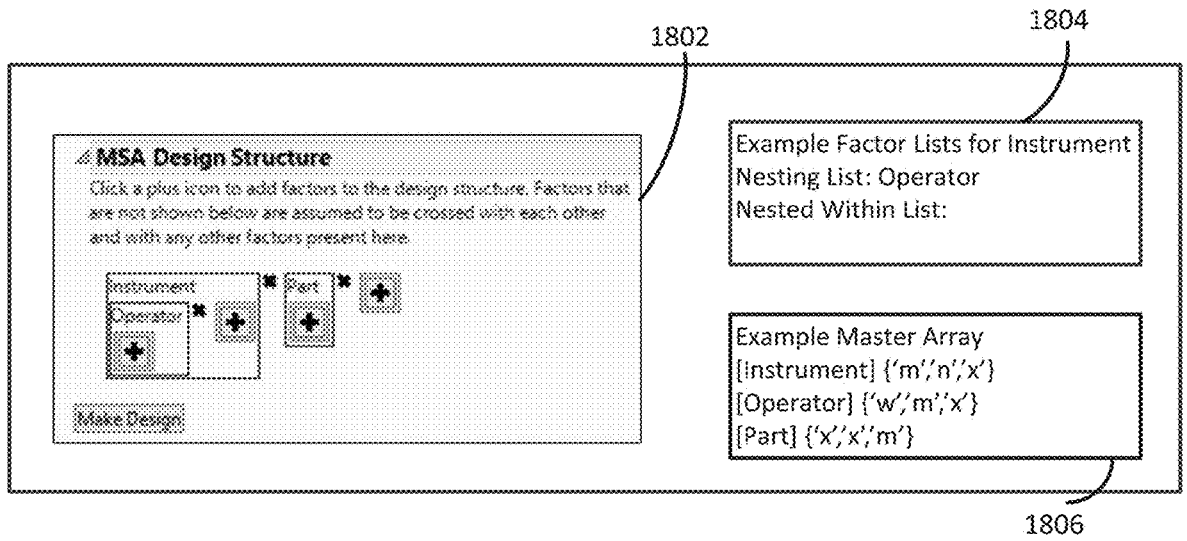
FIGS. 18A-18B provides example computing structures for designs with nested and crossed factors according to at least one embodiment of the present technology.
Figure 18B:
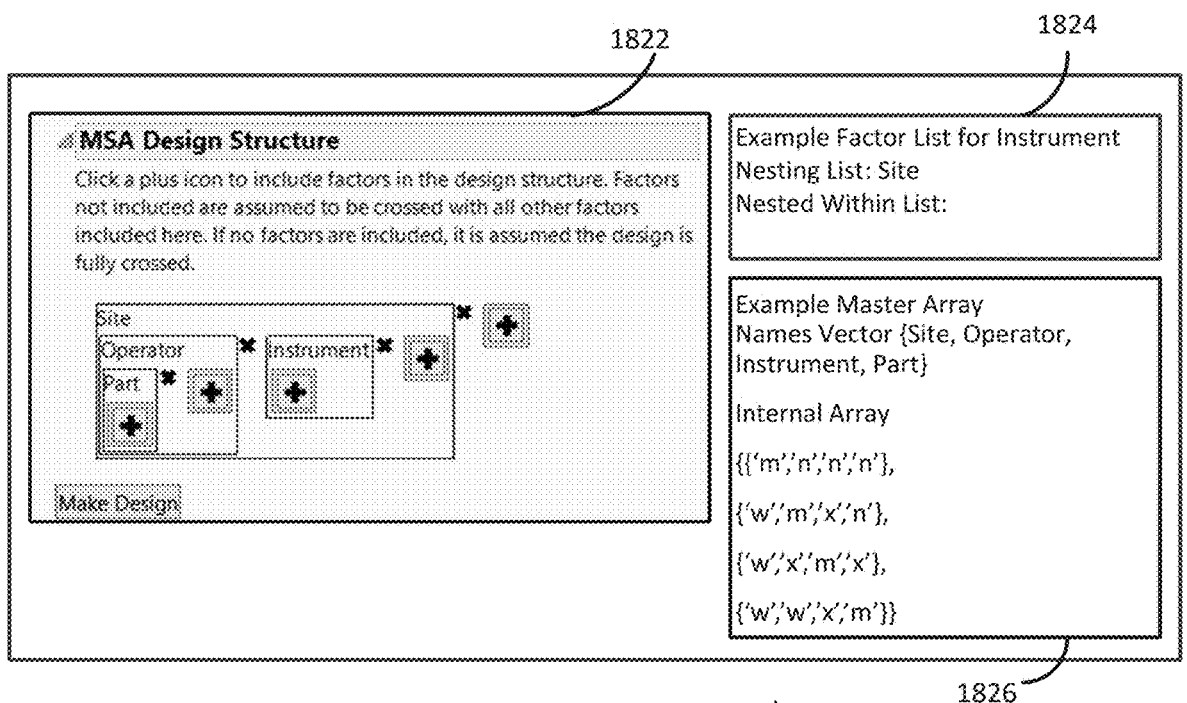

FIGS. 18A-18B illustrates an example computing structures for designs with nested and crossed factors for additional examples involving crossed factors. Graphical user interface 1800 in FIG. 18A shows an example design structure 1802 and an example factor list 1804 for the instrument factor. In this example factor list 1804, the nesting list for "instrument" contains the string name "Operator" and the nested within list is empty. The master array 1806 shows all the relationships for all the factors. Master array 1806 shows an array based on the order in which factors were first entered (instrument, then operator, and then part).

Graphical user interface 1820 in FIG. 18B shows an example design structure 1822 and an example factor list 1824 for the instrument factor. In this example factor list 1824, the nesting list for "instrument" contains the string name "Site" this time and the nested within list is empty. The master array 1826 shows all the relationships for all the factors. Master array 1826 shows an array based on the order in which factors were first entered (site, then operator, then instrument, and then part). One of ordinary skill in the art will appreciate other example structures than those described herein.

Figure 19A:
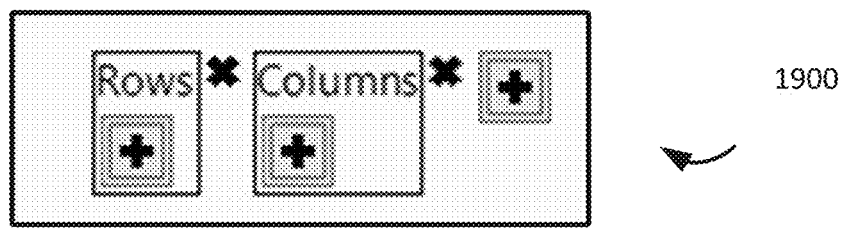
FIGS. 19A-19B illustrate example nested designs according to at least one embodiment of the present technology.
Figure 19B:
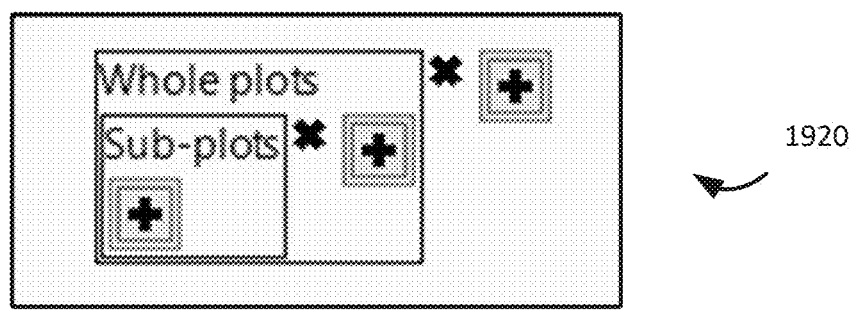

FIGS. 19A-19B illustrate example nested designs for a Measurement System Analysis (MSA) or Custom Design platforms. Using an MSA specification, FIG. 19A shows an example representation of a row column design with two crossed blocking factors (row and column). FIG. 19B shows a split-split plot design with eight whole plots, each containing four subplots, each of which contains four runs represented simply as sub-plots nested within whole plots. These types of designs in a measurement system analysis can be applied to a custom design platform. For instance, in a custom design platform there may be experimental factors that are applied to different strata/experimental units. For example, in FIG. 19B, experimental factors X1 & X2 may be applied to Whole Plots, experimental factors X3 & X4 to sub-plots, and experimental factors X5 & X6 "easy-to-change" (i.e., "Runs" at the bottom). Embodiments provide a graphical user interface for designing a design structure that can be used in different analysis platforms.

What is claimed is:

1. A computer-program product tangibly embodied in a non-transitory machine-readable storage medium, the computer-program product including system instructions configured to cause a computing system to:
   generate a nesting design by:
      generating a first icon representing a first factor of a nesting design structure, wherein the first icon is generated to comprise a first boundary defining a periphery of the first icon and a first nesting control positioned within the first boundary;
      detecting an actuation of the first nesting control;
      responsive to the detecting:
         generating a second icon representing a second factor of the nesting design structure, wherein the second icon is generated to comprise a second boundary defining a periphery of the second icon and a second nesting control within the second boundary; and
         for each of the first and second factors, generating one or more relationships between each other and one or more other factors of the nesting design structure; and
      outputting the first and second icons to an interactive graphical user interface such that the second icon is displayed as being nested within the first icon;
   generate a computer model configured to control a computer simulation of the nesting design by dynamically assigning, as input into the computer model, one or more model design cases to be executed by the computer simulation of the nesting design structure based on the nesting design structure and the one or more relationships and wherein the computing system constrains an amount of terms that comprise the computer model according to the nesting design structure in which the second icon is nested within the first icon;
   provide the computer model as input into the computer simulation, wherein the computer model controls execution of the computer simulation according to the nesting design structure and the one or more relationships;
   generate a computer-generated assessment of the nesting design based on a result of execution of the computer simulation; and
   output the computer-generated assessment of the nesting design to the interactive graphical user interface, wherein the computer-generated assessment graphically represents performance metrics of the nesting design in which the second icon is nested within the first icon.

2. The computer-program product of claim 1, wherein to generate the nesting design, the system instructions are further configured to cause the computing system to obtain, via the interactive graphical user interface:
   the first and second factors for the nesting design; and
   first and second sets of candidate options for the first and second factors, respectively.

3. The computer-program product of claim 2, wherein to generate the nesting design, the system instructions are further configured to cause the computing system to:
   portion the first set of candidate options into at least two groups of a first set of groups;
   portion the second set of candidate options into at least two groups of a second set of groups, wherein the first set of groups and the second set of groups are different;
   generate, responsive to the detecting of the actuation of the first nesting control, a group assignment for the nesting design, wherein the group assignment assigns a first group from the first set of groups for use with a second group of the second set of groups in the nesting design; and
   select, based on the group assignment, the first and second factors from the first and second sets of groups, wherein the first factor is selected from a first group in the first set of groups and wherein the second factor is selected from a second group in the second set of groups, and wherein the second group in the second set of groups is assigned to the first group in the first set of groups.

4. The computer-program product of claim 3:
   wherein the first factor is a categorical factor, and wherein the first set of candidate options comprise category options for the first factor; and
   wherein the second factor is a continuous factor, and wherein the second set of candidate options comprises a range set of one or more ranges for options for the second factor.

5. The computer-program product of claim 4:
   wherein to portion the first set of candidate options, the system instructions are configured to cause the computing system to distribute the category options to each group of the first set of groups; and
   wherein to portion the second set of candidate options, the system instructions are configured to cause the computing system to distribute the category options to each group of the second set of groups.

6. The computer-program product of claim 1, wherein the system instructions are further configured to cause the computing system to obtain, via the interactive graphical user interface, an indication that the first and second factors are crossed.

7. The computer-program product of claim 6, wherein responsive to obtaining the indication that the first and second factors are crossed, the system instructions are further configured to cause the computing system to:
   generate a cross-factor indicator for display to the user, wherein the cross-factor indicator graphically indicates that the first factor is crossed with the second factor according to the nesting design; and output the cross-factor indicator to the interactive graphical user interface, wherein the cross-factor indicator is displayed on the interactive graphical user interface within one of the first and second icons.

8. The computer-program product of claim 1, wherein the system instructions are further configured to cause the computing system to:
receive, via the interactive graphical user interface, a change indication to change one or more of:
an amount of factors in the nesting design;
an amount or range of candidate options for a given factor of the nesting design; and
an amount of design cases that are duplicated in the nesting design; and
update the interactive graphical user interface to display at least one updated computer-generated assessment accounting for the change indication.

9. The computer-program product of claim 1, wherein responsive to detecting a subsequent actuation of the first nesting control, the system instructions are further configured to cause the computing system to:
generate a third icon representing a third factor of the nesting design structure, wherein the third icon is generated to comprise a third boundary defining a periphery of the third icon and a third nesting control positioned within the third boundary; and
output the third icon to the interactive graphical user interface such that the third icon is displayed as being nested within the first icon.

10. The computer-program product of claim 9, wherein the system instructions are further configured to cause the computing system to:
generate a cross-factor indicator for display to the user, wherein the cross-factor indicator graphically indicates that the third factor is crossed with the first factor according to the nesting design; and
output the cross-factor indicator to the interactive graphical user interface, wherein the cross-factor indicator is displayed on the interactive graphical user interface within the boundary of the third icon.

11. The computer-program product of claim 1, wherein responsive to detecting an actuation of the second nesting control, the system instructions are further configured to cause the computing system to:
generate a third icon representing a third factor of the nesting design structure, wherein the third icon is generated to comprise a third boundary defining a periphery of the third icon and a third nesting control positioned within the third boundary; and
output the third icon to the interactive graphical user interface such that the third icon is displayed as being nested within the second icon.

12. The computer-program product of claim 11, wherein the system instructions are further configured to cause the computing system to:
generate a cross-factor indicator for display to the user, wherein the cross-factor indicator graphically indicates that the third factor is crossed with the second factor according to the nesting design; and
output the cross-factor indicator to the interactive graphical user interface, wherein the cross-factor indicator is displayed on the interactive graphical user interface within the boundary of the third icon.

13. The computer-program product of claim 1, wherein the system instructions are further configured to cause the computing system to:
generate a third icon representing a third factor of the nesting design structure, wherein the third icon is generated to comprise a third boundary defining a periphery of the third icon and a third nesting control positioned within the third boundary; and
output the third icon to the interactive graphical user interface such that the third icon is displayed externally to the boundaries of the first and second icons.

14. The computer-program product of claim 13, wherein the system instructions are further configured to cause the computing system to:
generate a cross-factor indicator for display to the user, wherein the cross-factor indicator graphically indicates that the third factor is crossed with one or both of the first and second factors according to the nesting design; and
output the cross-factor indicator to the interactive graphical user interface, wherein the cross-factor indicator is displayed on the interactive graphical user interface within the boundary of the third icon.

15. The computer-program product of claim 1, wherein the system instructions are further configured to cause the computing system to obtain, via the interactive graphical user interface:
a third factor for the nesting design; and
a third set of candidate options for the third factor.

16. The computer-program product of claim 15, wherein to generate the nesting design, the system instructions are further configured to cause the computing system to:
portion the third set of candidate options into at least two groups of a third set of groups, wherein the third set of groups is different from the first and second set of groups;
generate, responsive to the detecting of the actuation of the first nesting control, a group assignment for the nesting design, wherein the group assignment assigns a first group from one of the first and second set of groups for use with the third set of groups; and
select, based on the group assignment, the third factor from the third set of groups.

17. The computer-program product of claim 15, wherein to generate the nesting design, the system instructions are further configured to cause the computing system to distribute one or more selected options for the third factor from the third set of candidate options in design cases having factors that are crossed with the third factor.

18. The computer-program product of claim 1, wherein the computing system is configured to generate terms for the computer model by determining, based on one or more factor statuses for the first factor, one or more model types, the first factor indicating one or more of:
the first factor is nesting another factor of the nesting design;
the first factor is nested within another factor of the nesting design; and
the first factor is crossed with another factor of the nesting design.

19. The computer-program product of claim 1, wherein the generated computer-generated assessment indicates one or more of:
a variability caused by a factor of a measurement system analysis;
a likelihood of classification into one of multiple groups for a product set according to a measurement standard; and
a likelihood of going beyond a threshold that is related to the measurement standard.

20. The computer-program product of claim 1, wherein to generate the computer-generated assessment, the system instructions are configured to cause the computing system to:
generate a set of computer instructions for execution by the computing system;
execute the set of computer instructions; and
based on the execution of the set of computer instructions, generate the interactive graphical user interface to comprise one or more graphical representations of the computer-generated assessment.

21. A computer-implemented method comprising:
generating a nesting design by:
generating a first icon representing a first factor of a nesting design structure, wherein the first icon is generated to comprise a first boundary defining a periphery of the first icon and a first nesting control positioned within the first boundary;
detecting an actuation of the first nesting control;
responsive to the detecting:
generating a second icon representing a second factor of the nesting design structure, wherein the second icon is generated to comprise a second boundary defining a periphery of the second icon and a second nesting control within the second boundary; and
for each of the first and second factors, generating one or more relationships between each other and one or more other factors of the nesting design structure; and
outputting the first and second icons to an interactive graphical user interface such that the second icon is displayed as being nested within the first icon;
generating a computer model configured to control a computer simulation of the nesting design by dynamically assigning, as input into the computer model, one or more model design cases to be executed by the computer simulation of the nesting design structure based on the nesting design structure and the one or more relationships and wherein a computing system constrains an amount of terms that comprise the computer model according to the nesting design structure in which the second icon is nested within the first icon;
providing the computer model as input into the computer simulation, wherein the computer model controls execution of the computer simulation according to the nesting design structure and the one or more relationships;
generating a computer-generated assessment of the nesting design based on a result of execution of the computer simulation; and
outputting the computer-generated assessment of the nesting design to the interactive graphical user interface, wherein the computer-generated assessment graphically represents performance metrics of the nesting design in which the second icon is nested within the first icon.

22. The computer-implemented method of claim 21, further comprising obtaining, via the interactive graphical user interface, an indication that the first and second factors are crossed.

23. The computer-implemented method of claim 22, wherein responsive to obtaining the indication that the first and second factors are crossed, the method further comprises:
generating a cross-factor indicator for display to the user, wherein the cross-factor indicator graphically indicates that the first factor is crossed with the second factor according to the nesting design; and
outputting the cross-factor indicator to the interactive graphical user interface, wherein the cross-factor indicator is displayed on the interactive graphical user interface within one of the first and second icons.

24. The computer-implemented method of claim 21, wherein responsive to detecting a subsequent actuation of the first nesting control, the method further comprises:
generating a third icon representing a third factor of the nesting design structure, wherein the third icon is generated to comprise a third boundary defining a periphery of the third icon and a third nesting control positioned within the third boundary;
generating a cross-factor indicator for display to the user, wherein the cross-factor indicator graphically indicates that the third factor is crossed with the first factor according to the nesting design;
outputting the third icon to the interactive graphical user interface such that the third icon is displayed as being nested within the first icon; and
outputting the cross-factor indicator to the interactive graphical user interface such that the cross-factor indicator is displayed on the interactive graphical user interface within the boundary of the third icon.

25. The computer-implemented method of claim 21, wherein responsive to detecting an actuation of the second nesting control, the method further comprises:
generating a third icon representing a third factor of the nesting design structure, wherein the third icon is generated to comprise a third boundary defining a periphery of the third icon and a third nesting control positioned within the third boundary;
generating a cross-factor indicator for display to the user, wherein the cross-factor indicator graphically indicates that the third factor is crossed with the second factor according to the nesting design;
outputting the third icon to the interactive graphical user interface such that the third icon is displayed as being nested within the second icon; and
outputting the cross-factor indicator to the interactive graphical user interface such that the cross-factor indicator is displayed within the boundary of the third icon.

26. The computer-implemented method of claim 21, the method further comprising:
generating a third icon representing a third factor of the nesting design structure, wherein the third icon is generated to comprise a third boundary defining a periphery of the third icon and a third nesting control positioned within the third boundary;
generating a cross-factor indicator for display to the user, wherein the cross-factor indicator graphically indicates that the third factor is crossed with one or both of the first and second factors according to the nesting design;
outputting the third icon to the interactive graphical user interface such that the third icon is displayed externally to the boundaries of the first and second icons; and
outputting the cross-factor indicator to the interactive graphical user interface, wherein the cross-factor indicator is displayed on the interactive graphical user interface within the boundary of the third icon.

27. The computer-implemented method of claim 21, wherein generating the computer model comprises determining, based on one or more factor statuses for the first factor, one or more model types, the first factor indicating one or more of:

the first factor is nesting another factor of the nesting design;

the first factor is nested within another factor of the nesting design; and the first factor is crossed with another factor of the nesting design.

28. The computer-implemented method of claim 21, wherein the generated computer-generated assessment indicates one or more of:

a variability caused by a factor of a measurement system analysis;

a likelihood of classification into one of multiple groups for a product set according to a measurement standard; and a likelihood of going beyond a threshold that is related to the measurement standard.

29. The computer-implemented method of claim 21, wherein generating the computer-generated assessment comprises:

generating a set of computer instructions for execution by the computing system;

executing, by the computing system, the set of computer instructions; and based on the execution of the set of computer instructions, generating the interactive graphical user interface to comprise one or more graphical representations of the computer-generated assessment.

30. A computing device comprising processing circuitry and memory circuitry, the memory circuitry including instructions executable by the processing circuitry whereby the computing device is configured to:

generate a nesting design by:

generating a first icon representing a first factor of a nesting design structure, wherein the first icon is generated to comprise a first boundary defining a periphery of the first icon and a first nesting control positioned within the first boundary;

detecting an actuation of the first nesting control;

responsive to the detecting;

generating a second icon representing a second factor of the nesting design structure, wherein the second icon is generated to comprise a second boundary defining a periphery of the second icon and a second nesting control within the second boundary; and for each of the first and second factors, generating one or more relationships between each other and one or more other factors of the nesting design structure; and outputting the first and second icons to an interactive graphical user interface such that the second icon is displayed as being nested within the first icon;

generate a computer model configured to control a computer simulation of the nesting design by dynamically assigning, as input into the computer model, one or more model design cases to be executed by the computer simulation of the nesting design structure based on the nesting design structure and the one or more relationships and wherein a computing system constrains an amount of terms that comprise the computer model according to the nesting design structure in which the second icon is nested within the first icon;

provide the computer model as input into the computer simulation, wherein the computer model controls execution of the computer simulation according to the nesting design structure and the one or more relationships;

generate a computer-generated assessment of the nesting design based on a result of execution of the computer simulation; and output the computer-generated assessment of the nesting design to the interactive graphical user interface, wherein the computer-generated assessment graphically represents performance metrics of the nesting design in which the second icon is nested within the first icon.

* * * * *